United States Patent
Yang et al.

(10) Patent No.: US 12,457,769 B2
(45) Date of Patent: Oct. 28, 2025

(54) METHOD AND STRUCTURE FOR GATE-ALL-AROUND DEVICES WITH DEEP S/D CONTACTS

(71) Applicant: Taiwan Semiconductor Manufacturing Co., Ltd., Hsinchu (TW)

(72) Inventors: Chih-Chuan Yang, Hsinchu (TW); Shih-Hao Lin, Hsinchu (TW); Yu-Kuan Lin, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 698 days.

(21) Appl. No.: 17/462,634

(22) Filed: Aug. 31, 2021

(65) Prior Publication Data

US 2023/0063098 A1 Mar. 2, 2023

(51) Int. Cl.
*H10D 30/67* (2025.01)
*H10B 10/00* (2023.01)
(Continued)

(52) U.S. Cl.
CPC ....... *H10D 30/6735* (2025.01); *H10B 10/125* (2023.02); *H10D 30/031* (2025.01);
(Continued)

(58) Field of Classification Search
CPC ........... H01L 29/42392; H01L 29/0673; H01L 29/66553; H01L 29/66742;
(Continued)

(56) References Cited

U.S. PATENT DOCUMENTS

2019/0333820 A1* 10/2019 Chang ............... H01L 21/76843
2020/0135932 A1* 4/2020 Wang ................ H01L 29/41733
(Continued)

OTHER PUBLICATIONS

Lin-Yu Huang et al., "Method for Forming Source/Drain Contacts Utilizing an Inhibitor", U.S. Appl. No. 16/881,481, filed May 22, 2020, 27 pages specification, 16 pages drawings.
(Continued)

*Primary Examiner* — Syed I Gheyas
(74) *Attorney, Agent, or Firm* — HAYNES AND BOONE, LLP

(57) ABSTRACT

A method includes providing a substrate, a source/drain (S/D) feature and semiconductor channel layers over the substrate, a high-k metal gate (HKMG) wrapping around the channel layers, a dielectric cap over the HKMG, a contact etch stop layer (CESL) over the S/D feature and on sidewalls of the dielectric cap and the HKMG, and an interlayer dielectric (ILD) layer over the CESL. The channel layers are spaced one from another along a direction perpendicular to a top surface of the substrate and connect to the S/D feature. The method further includes etching the ILD layer and the CESL to expose a top portion of the S/D feature; etching the S/D feature, resulting in a S/D contact trench, wherein a bottom surface of the S/D contact trench is below an upper surface of a bottommost layer of the channel layers; and forming a metallic contact in the S/D contact trench.

20 Claims, 24 Drawing Sheets

(51) Int. Cl.
*H10D 30/01* (2025.01)
*H10D 62/10* (2025.01)
*H10D 64/01* (2025.01)

(52) U.S. Cl.
CPC ..... *H10D 30/6713* (2025.01); *H10D 30/6757* (2025.01); *H10D 62/121* (2025.01); *H10D 64/018* (2025.01)

(58) Field of Classification Search
CPC .......... H01L 29/78696; H10D 30/6735; H10D 62/121; H10D 30/014; H10D 30/43; H10D 30/797; H10D 62/832; H10D 84/038
See application file for complete search history.

(56) References Cited

U.S. PATENT DOCUMENTS

| | | | |
|---|---|---|---|
| 2020/0168722 A1* | 5/2020 | Hung | H01L 21/3247 |
| 2020/0266271 A1* | 8/2020 | Lin | H01L 29/775 |

OTHER PUBLICATIONS

Feng-Ching Chu et al., "Cut EPI Process and Structures", U.S. Appl. No. 16/887,273, filed May 29, 2020, Assignee: Taiwan Semiconductor Manufacturing Co., Ltd., 28 pages specification, 22 pages drawings.

Shih-Chiang Chen, et al. Method and Structure for Gate-All-Around Devices, U.S. Appl. No. 16/945,394, filed Jul. 31, 2020, Assignee: Taiwan Semiconductor Manufacturing Co., Ltd., 27 pages specification, 13 pages drawings.

Kuo-Hsiu Hsu, et al., "Four-Poly-Pitch SRAM Cell with Backside Metal Tracks", U.S. Appl. No. 16/888,269, filed May 29, 2020, Assignee: Taiwan Semiconductor Manufacturing Co., Ltd., 27 pages specification, 17 pages drawings.

Jhon Jhy Liaw, "Leakage Reduction in Gate-All-Around Devices", U.S. Appl. No. 16/994,274, filed Aug. 14, 2020, Assignee: Taiwan Semiconductor Manufacturing Co., Ltd., 38 pages specification, 21 pages drawings.

* cited by examiner

METHOD AND STRUCTURE FOR GATE-ALL-AROUND DEVICES WITH DEEP S/D CONTACTS

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all-around (GAA) device, referring to vertically-stacked horizontally-oriented multi-channel transistors, such as nanowire transistors and nanosheet transistors. GAA devices enable aggressive scaling of IC technologies, maintaining gate control and mitigating SCEs, while seamlessly integrating with conventional IC manufacturing processes. However, there are challenges with GAA devices too. One challenge is how to reduce the electrical resistance through the transistor and through source/drain contacts. Accordingly, although existing GAA devices and methods for fabricating the same have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
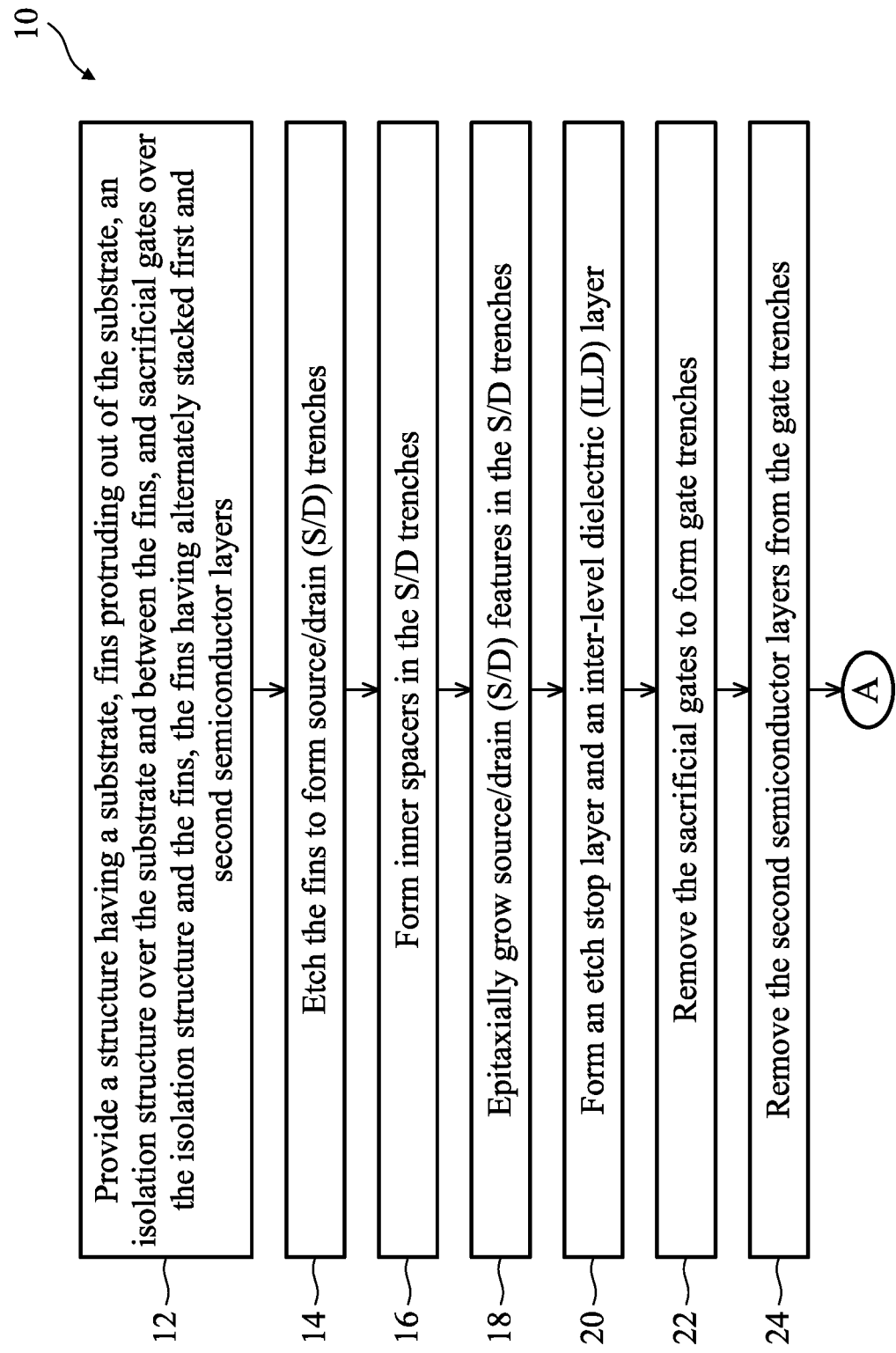
FIG. 1A and FIG. 1B are a flow chart of a method for fabricating a multi-gate device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This present disclosure relates generally to semiconductor devices and their manufacturing methods, and more particularly to forming deep S/D contacts in gate-all-around (GAA) devices, such as nanosheet devices or nanowire devices. In a GAA device, source/drain (S/D) features may be deep (or tall) in order to connect with all the channel layers of the device. Consequently, S/D contacts sitting on top the S/D features may be far away from some of the channel layers, particularly the bottommost channel layer. In some instances, the resistance through the transistor and the S/D contacts can be undesirably large. With deep S/D contacts according to the present disclosure, the distance between the channel layers of a GAA device and the S/D contacts is reduced, thereby reducing the resistance in the electrical path through the channel layers and the S/D contacts. For example, such deep S/D contacts are particularly suitable for PMOS transistors, such as the pull-up transistors of SRAM cells where channel mobility may not be a great concern while reduction in the electrical resistance is highly desirable. These and other aspects of the present disclosure are further described by referring to the accompanied figures.

Figure 1B:
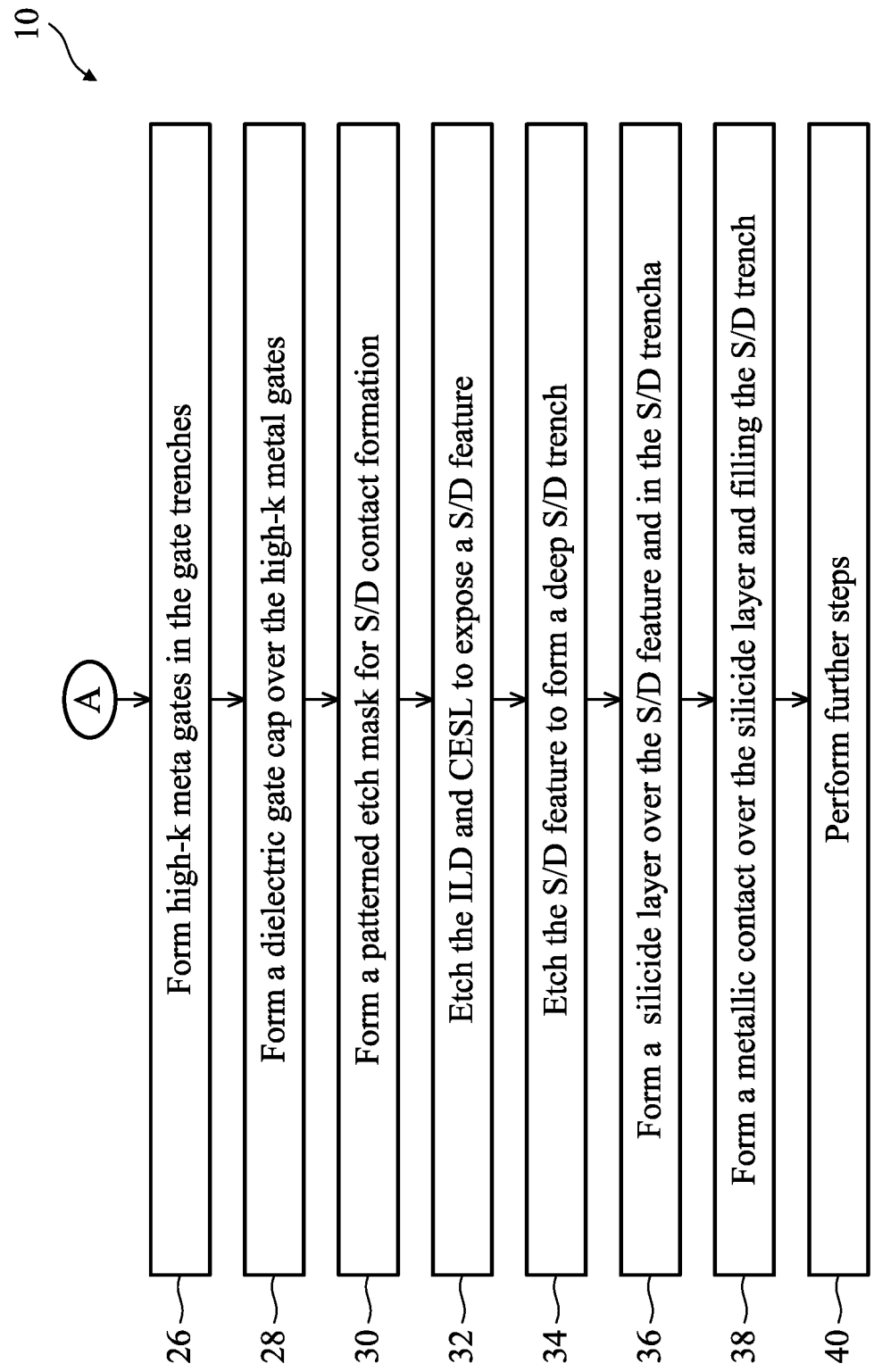
Figure 2A:
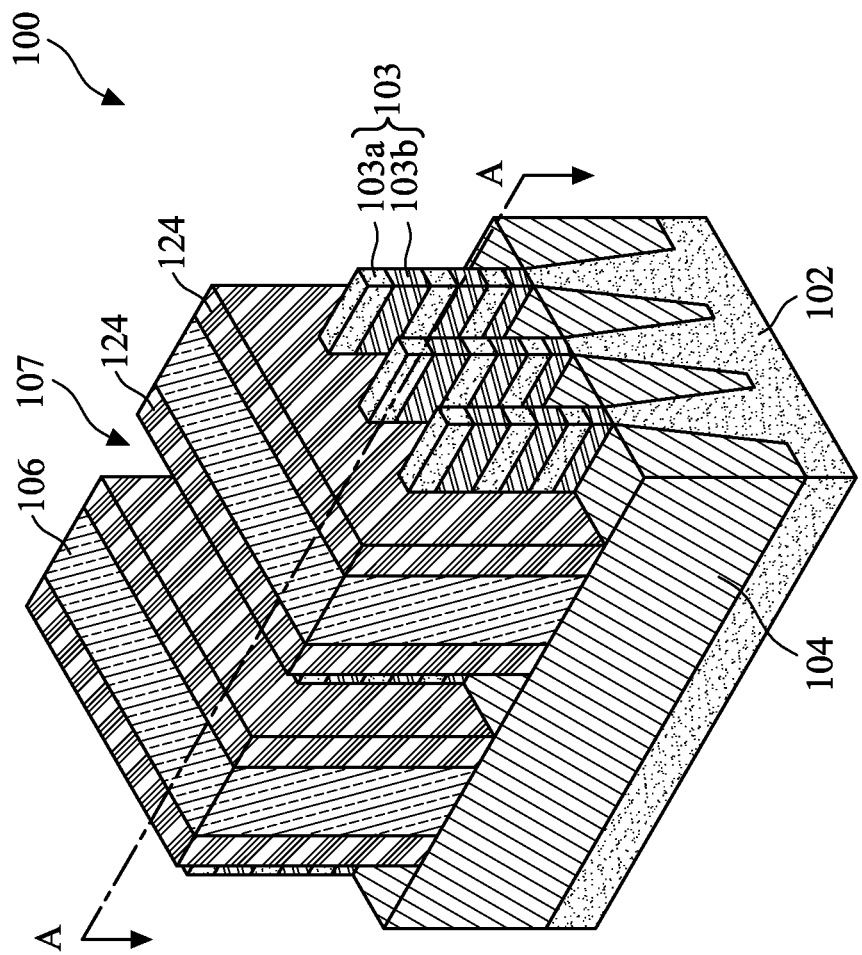
FIG. 2A is a diagrammatic perspective view of a multi-gate device, in portion, at a fabrication stage of the method in FIG. 1A and FIG. 1B, according to various aspects of the present disclosure.

FIG. 1A and FIG. 1B are a flow chart of a method 10 for fabricating a multi-gate device 100 according to various aspects of the present disclosure. In some embodiments, the multi-gate device 100 includes GAA transistors. FIG. 2A is a diagrammatic perspective view of the multi-gate device 100, in portion, at a fabrication stage of the method 10, according to some aspects of the present disclosure. FIGS. 2B, 3-13, and 16-22 are diagrammatic cross-sectional views of the multi-gate device 100 along the A-A line of FIG. 2A, in portion, at various fabrication stages associated with the method 10, according to aspects of the present disclosure. Additional processing is contemplated by the present disclosure. Additional operations can be provided before, during, and after the method 10, and some of the operations described can be moved, replaced, or eliminated for additional embodiments of the method 10.

The multi-gate device 100 may be included in a microprocessor, a memory, and/or other IC device. In some embodiments, the multi-gate device 100 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), FinFET, nanosheet FETs, nanowire FETs, other types of multi-gate FETs, complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the multi-gate device 100 is included in memory devices, such as static random access memory (SRAM), non-volatile random access memory (NVRAM), flash memory, an electrically erasable programmable read only memory (EEPROM), an electrically programmable read-only memory (EPROM), other suitable memory type, or combinations thereof. FIGS. 2A-22 have been simplified for the sake of clarity to better understand the inventive concepts of the present disclosure. Additional features can be added in the multi-gate device 100, and some of the features described below can be replaced, modified, or eliminated in other embodiments of the multi-gate device 100. The fabrication of the device 100 is described below in conjunction with embodiments of the method 10.

Figure 2B:
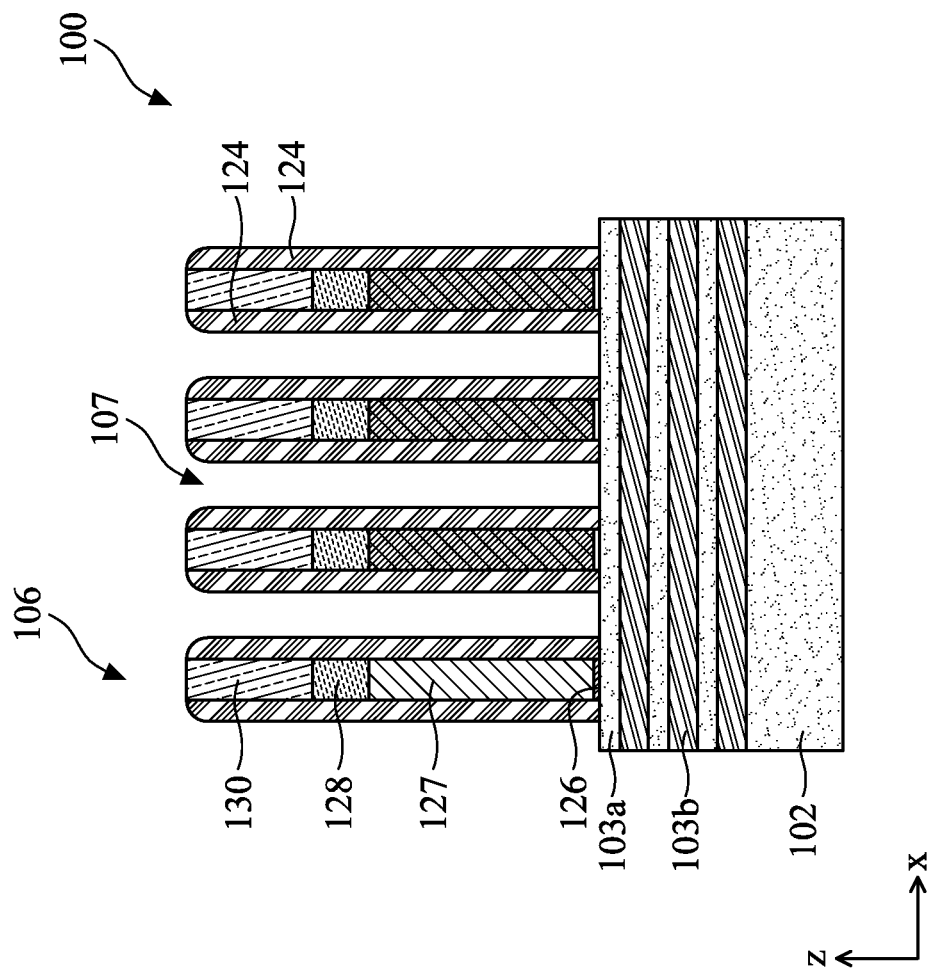
FIGS. 2B, 3, 4, 5, 6, 7, 8, 9, 10, 11, 12, 13, 16, 17, 18, 19, 20, 21, and 22 are diagrammatic cross-sectional views of a multi-gate device, in portion, at various fabrication stages associated with the method in FIG. 1A and FIG. 1B, according to various aspects of the present disclosure.

At operation 12, the method 10 (FIG. 1A) provides an initial structure of the device 100. Turning to FIGS. 2A-2B, the device 100 includes a substrate 102, fins 103 extending from the substrate 102, isolation structure 104 over the substrate 102 and between lower portions of the fins 103, sacrificial gate stacks 106 over the fins 103 and the isolation structure 104, and gate spacers 124 on sidewalls of the sacrificial gate stacks 106. Each sacrificial gate stack 106 includes a sacrificial gate dielectric layer 126, a sacrificial gate electrode layer 127, and hard mask layers 128 and 130. Each of the fins 103 includes a stack of semiconductor layers 103a and 103b. The S/D regions of the fins 103 are exposed in trenches 107 between the sacrificial gate stacks 106. The various components of the device 100 are further described below.

In the present embodiment, the substrate 102 includes silicon. For example, it is a silicon wafer. Alternatively or additionally, substrate 102 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 102 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 102 can include various doped regions depending on design requirements of the device 100. For example, the substrate 102 may include p-type doped regions configured for n-type GAA transistors and n-type doped regions configured for p-type GAA transistors. P-type doped regions are doped with p-type dopants, such as boron, indium, other p-type dopant, or combinations thereof. N-type doped regions are doped with n-type dopants, such as phosphorus, arsenic, other n-type dopant, or combinations thereof. In some implementations, the substrate 102 includes doped regions formed with a combination of p-type dopants and n-type dopants. The various doped regions can be formed directly on and/or in the substrate 102, for example, providing a p-well structure, an n-well structure, a dual-well structure, a raised structure, or combinations thereof. An ion implantation process, a diffusion process, and/or other suitable doping process can be performed to form the various doped regions.

Each of the fins 103 includes semiconductor layers 103a and semiconductor layers 103b stacked vertically (e.g., along the z-direction) in an interleaving or alternating configuration from a surface of the substrate 102. In some embodiments, the semiconductor layers 103a and the semiconductor layers 103b are epitaxially grown in the depicted interleaving and alternating configuration, layer-by-layer, until a desired number of semiconductor layers is reached. In the depicted embodiment, each fin 103 includes three semiconductor layers 103a and three semiconductor layers 103b. However, the present disclosure contemplates embodiments where each fin 103 includes more or less semiconductor layers, for example, depending on a number of channels desired for the device 100. For example, each fin 103 may include two to ten semiconductor layers 103a and two to ten semiconductor layers 103b in some embodiments. A composition of the semiconductor layers 103a is different than a composition of the semiconductor layers 103b to achieve etching selectivity and/or different oxidation rates during subsequent processing. For example, the semiconductor layers 103a and 103b may include different materials, different constituent atomic percentages, different constituent weight percentages, and/or other different characteristics to achieve desired etching selectivity during an etching process, such as an etching process implemented to form suspended channel layers in channel regions of the device 100. In the present embodiment, the semiconductor layers 103a include silicon and the semiconductor layers 103b include silicon germanium, which has a different etch selectivity than silicon. In some embodiments, the semiconductor layers 103a and 103b can include the same material but with different constituent atomic percentages to achieve the etching selectivity and/or different oxidation rates. For example, the semiconductor layers 103a and 103b can include silicon germanium, where the semiconductor layers 103a have a first silicon atomic percent and/or a first germanium atomic percent and the semiconductor layers 103b have a second, different silicon atomic percent and/or a second, different germanium atomic percent. The present disclosure contemplates that the semiconductor layers 103a and 103b include any combination of semiconductor materials that can provide desired etching selectivity, desired oxidation rate differences, and/or desired performance characteristics (e.g., materials that maximize current flow), including any of the semiconductor materials disclosed herein. In some embodiments, thickness of each semiconductor layer 103a is about 1 nm to about 10 nm, thickness of each semiconductor layer 103b is about 1 nm to about 10 nm, and the two thicknesses can be the same or different.

The fins 103 may be patterned from a stack of semiconductor layers (103a and 103b) by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 103. For example, the masking element may be used for etching recesses into semiconductor layers over or in the substrate 102, leaving the fins 103 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 103 may be suitable.

The isolation structure 104 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 104 is formed by etching trenches in or over the substrate 102 (e.g., as part of the process of forming the fins 103), filling the trenches with an insulating material, and performing a chemical mechanical planarization (CMP) process and/or an etching back process to the insulating material, leaving the remaining insulating material as the isolation structure 104. Other types of isolation structure may also be suitable, such as field oxide and LOCal Oxidation of Silicon (LOCOS). The isolation structure 104 may include a multi-layer structure, for example, having one or more liner layers (e.g., silicon nitride) on surfaces of the substrate 102 and the fins 103 and a main isolating layer (e.g., silicon dioxide) over the one or more liner layers.

The sacrificial gate dielectric layer 126 may include a dielectric material such as silicon oxide (e.g., $SiO_2$) or silicon oxynitride (e.g., SiON), and may be formed by chemical oxidation, thermal oxidation, atomic layer deposition (ALD), CVD, and/or other suitable methods. The sacrificial gate electrode layer 127 may include poly-crystalline silicon (poly-Si) or other material(s) and may be formed by suitable deposition processes such as low-pressure chemical vapor deposition (LPCVD) and plasma-enhanced CVD (PECVD). The hard mask layer 128 may include silicon nitride or other suitable dielectric material and may be formed by CVD or other suitable methods. The hard mask layer 130 may include silicon oxide or other suitable dielectric material and may be formed by CVD or other suitable methods. The various layers 126, 127, 128, and 130 may be patterned by photolithography and etching processes. The gate spacers 124 may comprise a dielectric material, such as silicon oxide, silicon nitride, silicon oxynitride, silicon carbide, other dielectric material, or combinations thereof, and may comprise one or multiple layers of material. The gate spacers 124 may be formed by depositing a spacer material as a blanket over the isolation structure 104, the fins 103, and the sacrificial gate stacks 106. Then the spacer material is etched by an anisotropic etching process to expose the isolation structure 104, the hard mask layer 130, and a top surface of the fins 103. Portions of the spacer material on the sidewalls of the sacrificial gate stacks 106 become the gate spacers 124. Adjacent gate spacers 124 provide openings 107 that expose portions of the fins 103 in the S/D regions of the device 100.

Figure 3:
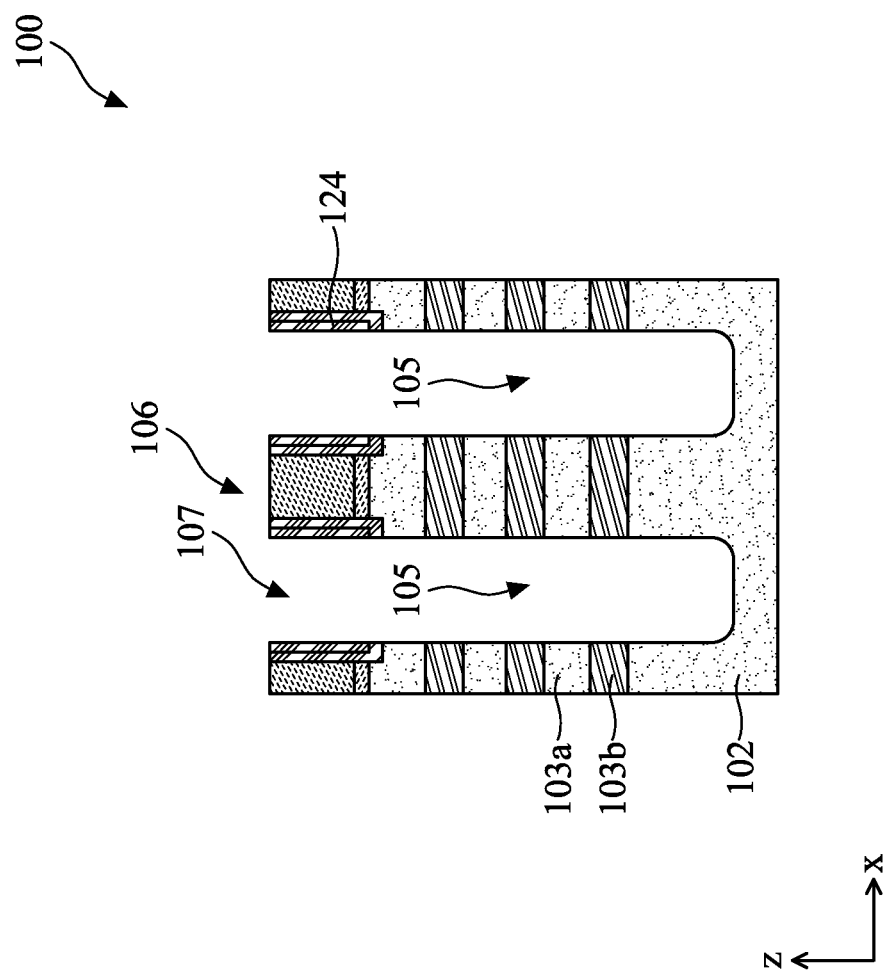

At operation 14, the method 10 (FIG. 1A) etches the fins 103 to form S/D trenches 105 (FIG. 3). Operation 14 may include one or more photolithography process and etching processes. For example, the photolithography process may form a masking element covering areas of the device 100 that are not to be etched. The masking element provides openings through which the fins 103 are etched. In an embodiment, the etching process may include dry etching, wet etching, reactive ion etching (RIE), and/or other suitable processes, as discussed earlier. Further, the etching process is tuned selective to the materials of the fins 103, and with little to no etching to the gate spacers 124, the hard mask layer 130, and the isolation structure 104. As a result of the etching process, various surfaces of the semiconductor layers 103a and 103b are exposed in each S/D trench 105.

Figure 4:
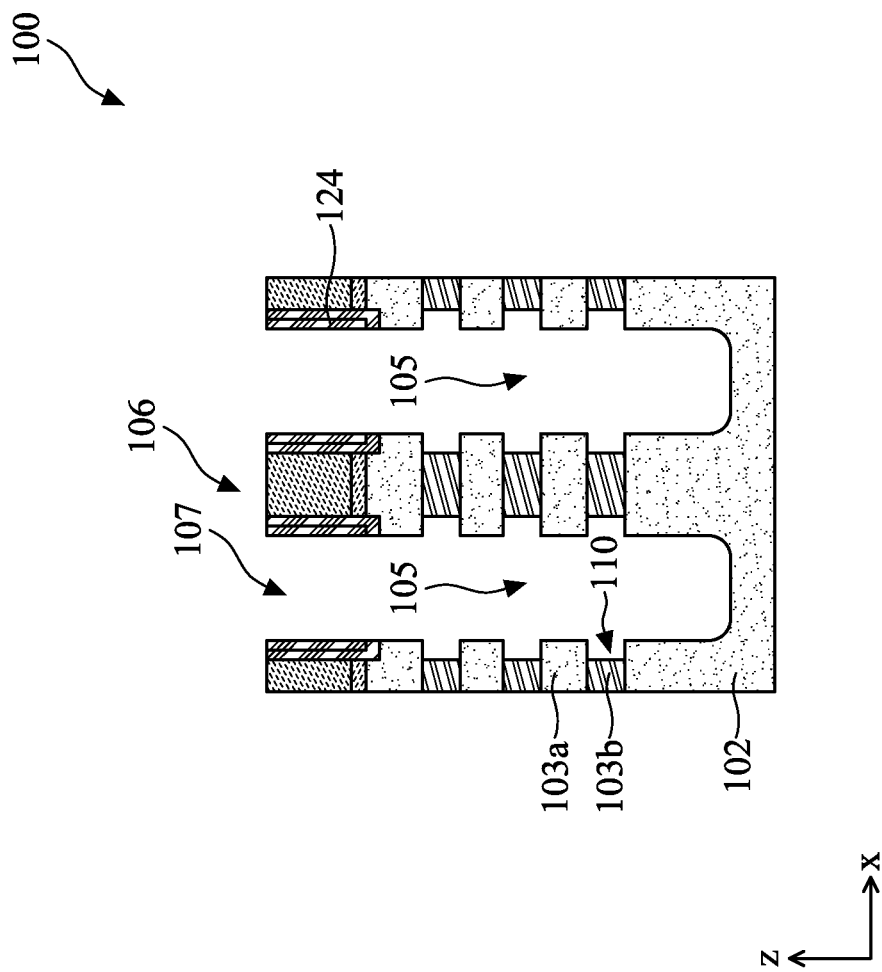
Figure 6:
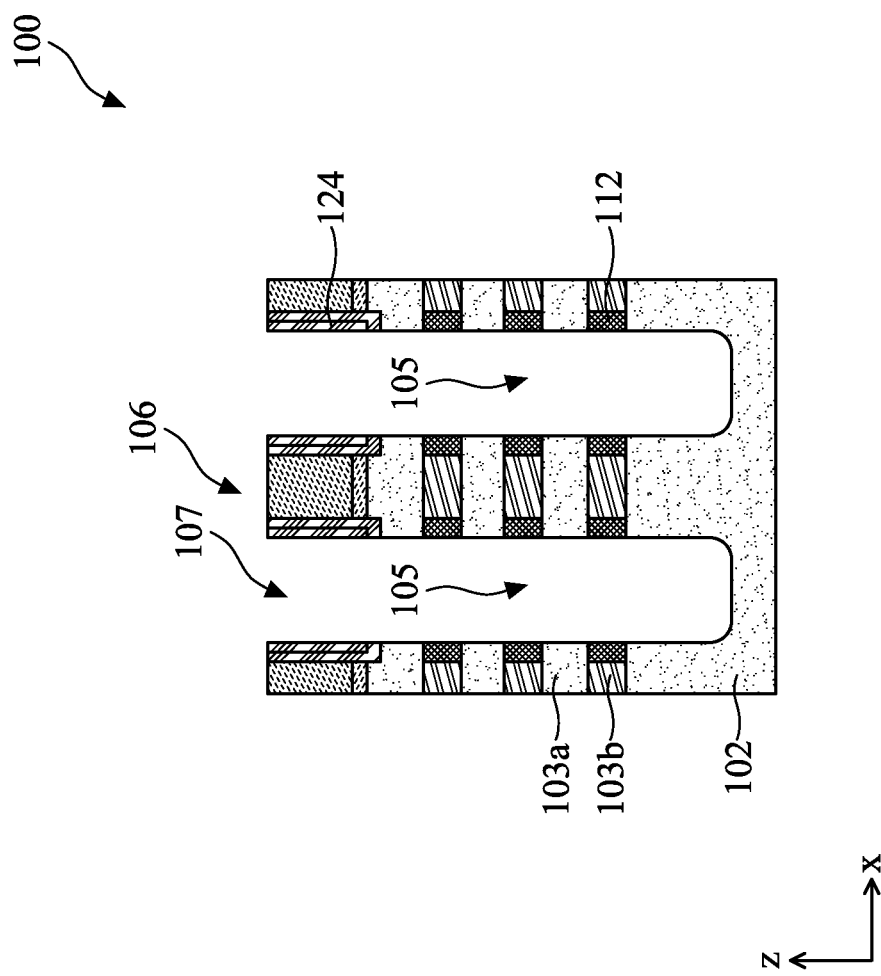

At operation 16, the method 10 (FIG. 1A) forms inner spacers 112 in the S/D trenches 105 and vertically between adjacent semiconductor layers 103a, such as shown in FIG. 6. This may involve multiple steps. For example, the operation 16 may first partially etch the semiconductor layers 103b within the S/D trench 105, thereby creating gaps 110 between every two adjacent semiconductor layers 103a and between the bottommost semiconductor layer 103a and the substrate 102, such as shown in FIG. 4. The gaps 110 may be etched to have a rectangular, trapezoidal, funnel, or round profile or another shape. The etching process is tuned selective to the material of the semiconductor layers 103b, and with little to no etching to the gate spacers 124, the hard mask layer 130, the isolation structure 104, and the semiconductor layers 103a.

Figure 5:
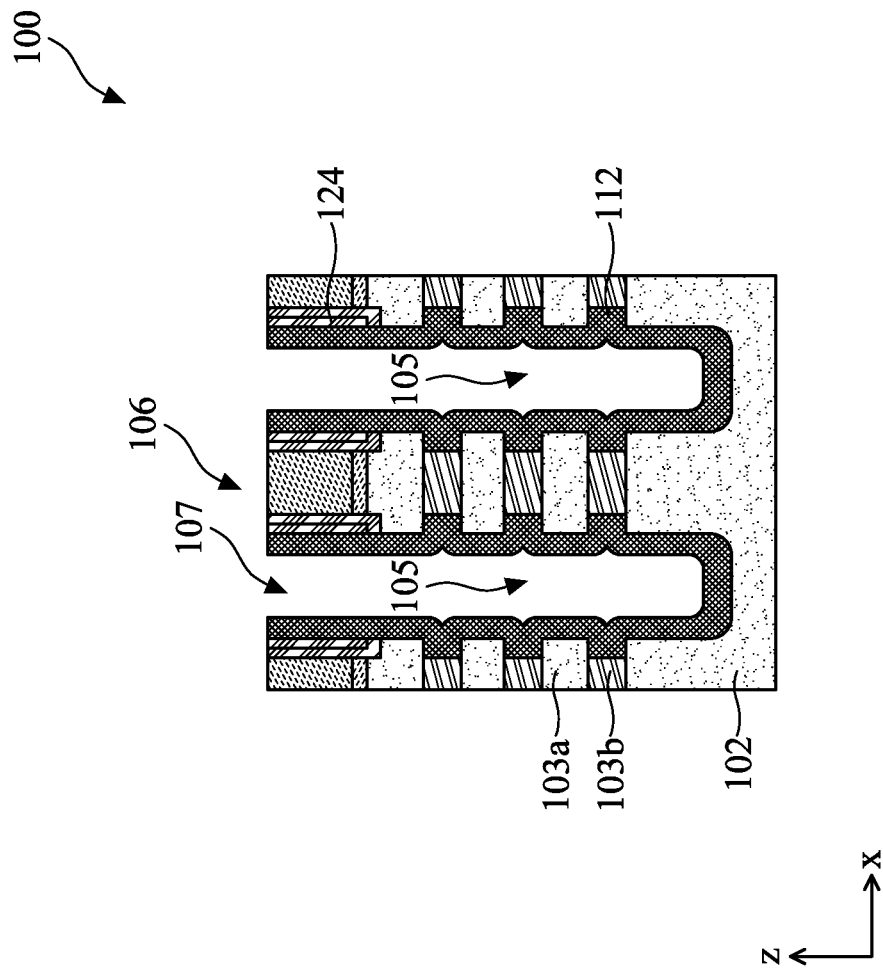

Subsequently, the operation 16 may deposit a dielectric layer 112 along the various exposed surfaces of the device 100, such as shown in FIG. 5. Particularly, the dielectric layer 112 is deposited on the sidewalls of the gate spacers 124 and the surfaces of the semiconductor layers 103a and 103b exposed in the S/D trenches 105. In various embodiments, the dielectric layer 112 may include a material that is different than materials in the semiconductor layers 103b and the gate spacers 124 to achieve desired etching selectivity during subsequent etching processes. In some embodiments, the dielectric layer 112 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the dielectric layer 112 includes a low-k dielectric material. Example low-k dielectric materials include fluoride-doped silica glass, carbon doped silicon oxide, Xerogel, Aerogel, amorphous fluorinated carbon, Parylene, Benzocyclobutene (BCB), polyimide, other low-k dielectric material, or combinations thereof.

Then, the operation 16 may perform an etch-back process to the dielectric layer 112. The etch-back process partially removes the dielectric layer 112. Particularly, as illustrated in FIG. 6, the dielectric layer 112 is removed from the surfaces of the gate spacers 124 and the substrate 102. In the present embodiment, only portions of the dielectric layer 112 in the gap 110 still remain in the device 100. The remaining portions of the dielectric layer 112 are referred to as an inner spacer 112 (or inner spacer features 112) of the device 100. In various embodiments, the etch-back process may apply dry etching, wet etching, or reactive ion etching that is tuned selective to the material of the dielectric layer 112, and with little to no etching of the semiconductor layers 103a, the sacrificial gate stacks 106, and the gate spacers 124. For example, the etch-back process may apply an isotropic wet etching process. In view of the topography of the device 100, an isotropic wet etching process is effective in removing the dielectric layer 112 from the various surfaces other than those portions in the gap 110, as discussed above. As a result of the operation 16, surfaces of the semiconductor layers 103a and the substrate 102 are exposed in the S/D trenches 105.

Figure 7:
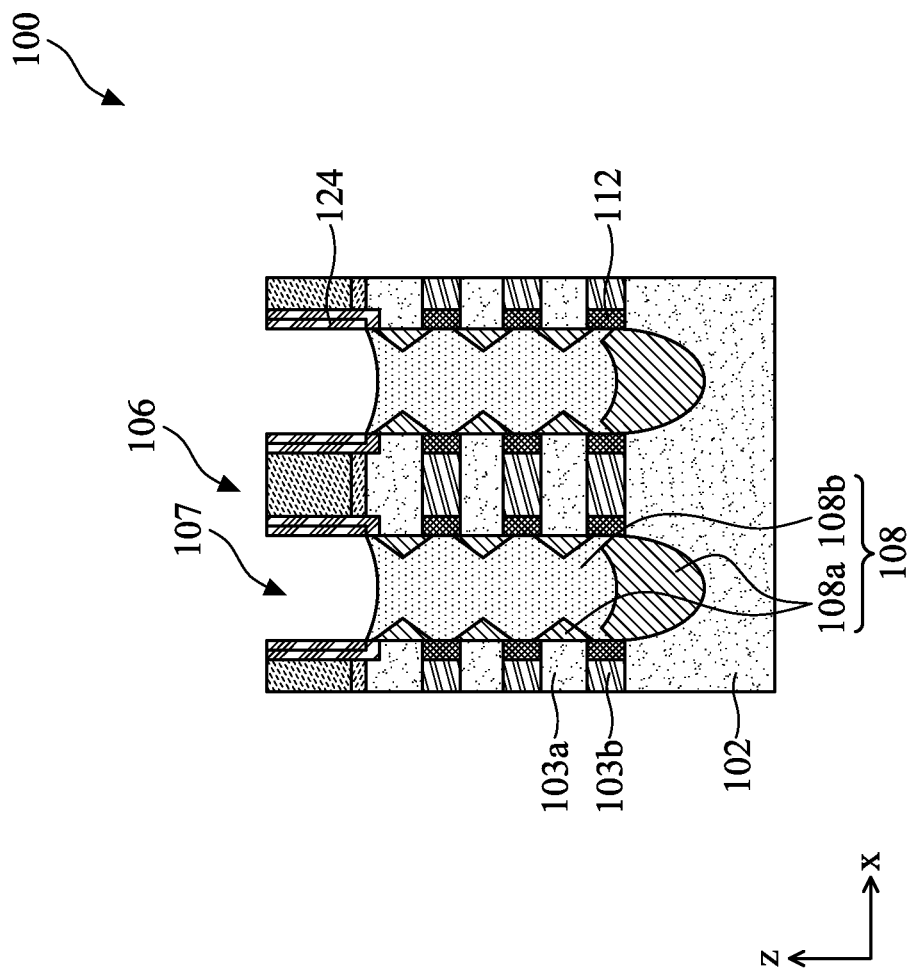

At operation 18, the method 10 (FIG. 1A) epitaxially grows source/drain (S/D) features 108 from the surfaces of the semiconductor layers 103a and the substrate 102 that are exposed in the S/D trenches 105, such as illustrated in FIG. 7. An epitaxy process can use chemical vapor deposition (CVD) techniques (for example, vapor phase epitaxy and/or Ultra-High Vacuum CVD), molecular beam epitaxy, other suitable epitaxial growth processes, or combinations thereof. The epitaxy process can use gaseous and/or liquid precursors, which interact with the composition of the substrate 102 and the semiconductor layers 103a. The method 10 may also dope the epitaxial source/drain features 108 with n-type dopants and/or p-type dopants. In some embodiments, for n-type transistors, the epitaxial source/drain features 108 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, the epitaxial source/drain features 108 include silicon germanium or germanium, and can be doped with boron, other p-type dopant, or combinations thereof (for example, forming Si:Ge:B epitaxial source/drain features).

In some embodiments, the epitaxial source/drain features 108 may include multiple epitaxial semiconductor layers where the multiple epitaxial semiconductor layers have different levels of dopant concentration. For example, in the embodiment depicted in FIG. 7, the source/drain features 108 include a first epitaxial layer 108a and a second epitaxial layer 108b over the first epitaxial layer 108a. The first epitaxial layer 108a is grown out of (or directly interfacing with) the substrate 102 and the semiconductor layers 103a, and the second epitaxial layer 108b is grown out of the first epitaxial layer 108a. The second epitaxial layer 108b is more highly doped with a dopant than the first epitaxial layer 108a. In an example, the first epitaxial layer 108a includes $Si_{1-x}Ge_x$ and the second epitaxial layer 108b includes $Si_{1-y}Ge_y$, where y is greater than x. For example, x may be in a range of 20% to 30%, and y may be in a range of 35% to 60%. Further, the second epitaxial layer 108b ($Si_{1-y}Ge_y$) is more highly doped with boron than the first epitaxial layer 108a ($Si_{1-x}Ge_x$). For example, the first epitaxial layer 108a ($Si_{1-x}Ge_x$) may be doped with boron with a dopant concentration in a range of 1E20 to 5E20, and the second epitaxial layer 108b ($Si_{1-y}Ge_y$) may be doped with boron with a dopant concentration in a range of 5E20 to 1E21. The doping can be in-situ (i.e., doped during deposition by adding impurities to a source material of the epitaxy process) or ex-situ (e.g., doped by an ion implantation process subsequent to a deposition process). In some embodiments, annealing processes (e.g., rapid thermal annealing (RTA) and/or laser annealing) are performed to activate dopants in the epitaxial source/drain features 108. In various embodiments, the epitaxial source/drain features 108 may include a single epitaxial layer, two epitaxial layers, or more than two epitaxial layers.

Figure 8:
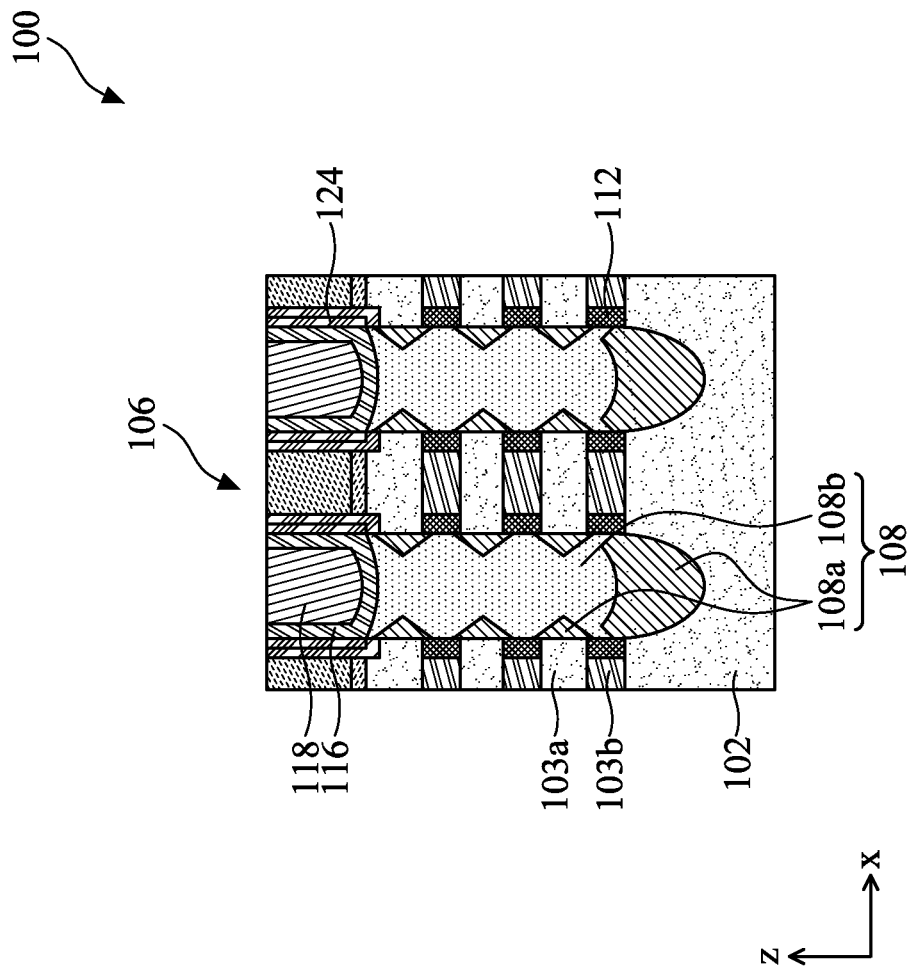

At operation 20, the method 10 (FIG. 1A) forms a contact etch stop layer (CESL) 116 and an inter-level dielectric (ILD) layer 118 over the device 100 (FIG. 8). As illustrated in FIG. 8, the CESL 116 is formed over the S/D features 108 and the sidewalls of the gate spacers 124. The ILD layer 118 is deposited over the CESL 116. The CESL 116 may comprise silicon nitride, silicon oxynitride, silicon nitride with oxygen (O) or carbon (C) elements, and/or other materials; and may be formed by CVD, PVD, ALD, or other suitable methods. In an embodiment, the CESL 116 is deposited to a substantially uniform thickness along the various surfaces discussed above. The ILD layer 118 may comprise tetraethylorthosilicate (TEOS) formed oxide, undoped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The ILD layer 118 may be formed by PECVD (plasma enhanced CVD), FCVD (flowable CVD), or other suitable methods. The ILD layer 118 fills the various trenches between the sacrificial gate stacks 106 and between the S/D features 108.

Figure 9:
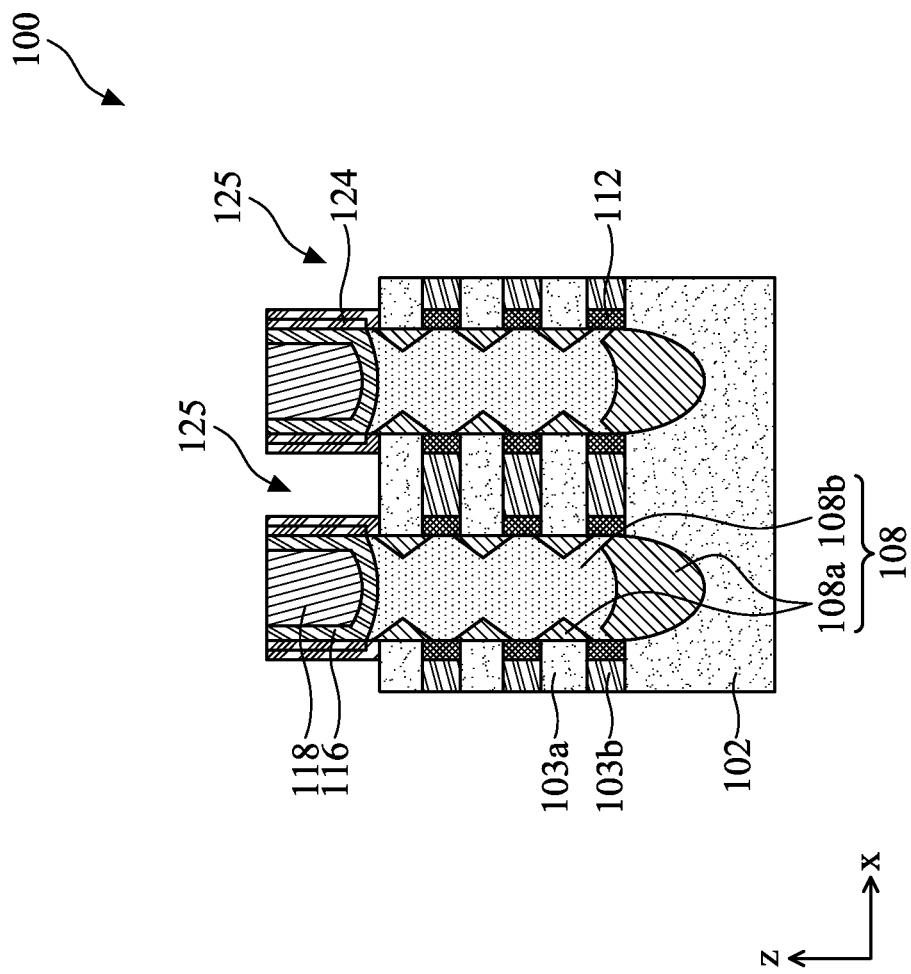

At operation 22, the method 10 (FIG. 1A) removes the sacrificial gate stacks 106 from the device 100, thereby forming gate trenches 125 (FIG. 9). In an embodiment, the operation 22 may perform a CMP process to the device 100 to expose a top surface of the sacrificial gate stacks 106, and then perform one or more etching process to remove the sacrificial gate stacks 106, including the hard mask layers 128 and 130, the sacrificial gate electrode layer 127, and the sacrificial gate dielectric layer 126 as shown in FIG. 8. The etching process may include dry etching, wet etching, reactive ion etching, combinations thereof, or other suitable etching processes. The etching process is tuned selective to the materials of the sacrificial gate stacks 106, with little to no etching to the ILD layer 118, the CESL 116, the gate spacers 124, and the fins 103 (including the semiconductor layers 103a and 103b). As depicted in FIG. 9, the etching process results in gate trenches 125 between two opposing gate spacers 124. The gate trenches 125 expose channel regions of the fins 103.

Figure 10:
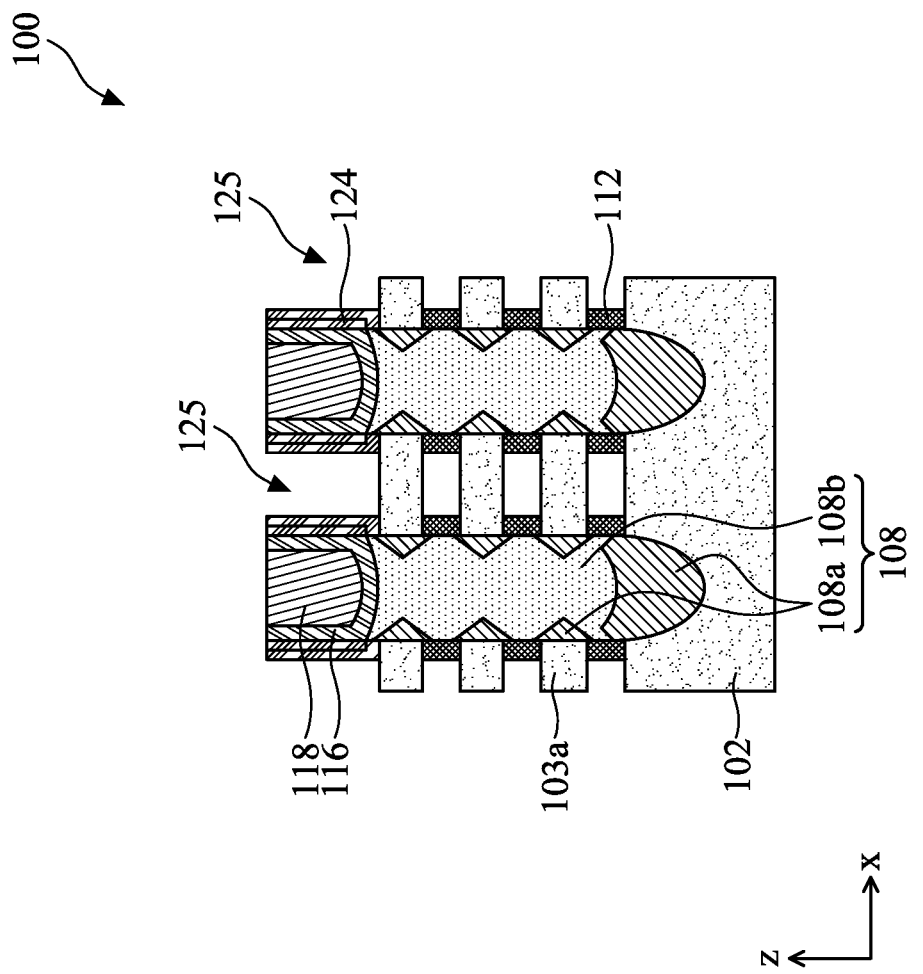

At operation 24, the method 10 (FIG. 1A) selectively removes the semiconductor layers 103b from the gate trenches 125 (FIG. 10). This process is also referred to as a channel release process in some embodiments. In the embodiment depicted in FIG. 10, an etching process selectively etches the semiconductor layers 103b with little to no etching of the semiconductor layers 103a and, in some embodiments, little to no etching of the gate spacers 124 and/or the inner spacer features 112. Various etching parameters can be tuned to achieve selective etching of the semiconductor layers 103b, such as etchant composition, etching temperature, etching solution concentration, etching time, etching pressure, source power, RF bias voltage, RF bias power, etchant flow rate, other suitable etching parameters, or combinations thereof. The etching process can be a dry etching process, a wet etching process, other suitable etching process, or combinations thereof. In some embodiments, a dry etching process (such as a surface gas/radical reaction process) utilizes a fluorine-containing gas (for example, HF, $F_2$, $NF_3$, $CF_4$, $SF_6$, $CH_2F_2$, $CHF_3$, and/or $C_2F_6$) to selectively etch the semiconductor layers 103b which include silicon germanium. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch the semiconductor layers 103b. In some embodiments, a chemical vapor phase etching process using hydrochloric acid (HCl) selectively etches the semiconductor layers 103b. Because of the etch selectivity, the inner spacer features 112 protects the S/D features 108 from the etching process. As illustrated in FIG. 10, in the present embodiment, one side of the inner spacer feature 112 is exposed in the gate trench 125. The other side of the inner spacer feature 112 is in direct contact with the S/D feature 108.

As a result of the operation 24, the semiconductor layers 103a are suspended over the substrate 102 and connecting the S/D features 108 on opposing sides of each gate trench 125. The semiconductor layers 103a are also referred to as channel layers 103a or semiconductor channel layers 103a. In some embodiments, after removing the semiconductor layers 103b, an etching process is performed to modify a profile of the semiconductor layers 103a to achieve desired dimensions and/or desired shapes (e.g., cylindrical-shaped (e.g., nanowire), rectangular-shaped (e.g., nanobar), sheet-shaped (e.g., nanosheet), etc.). The present disclosure further contemplates embodiments where the semiconductor layers 103a have sub-nanometer dimensions depending on design requirements of the device 100.

Figure 11:
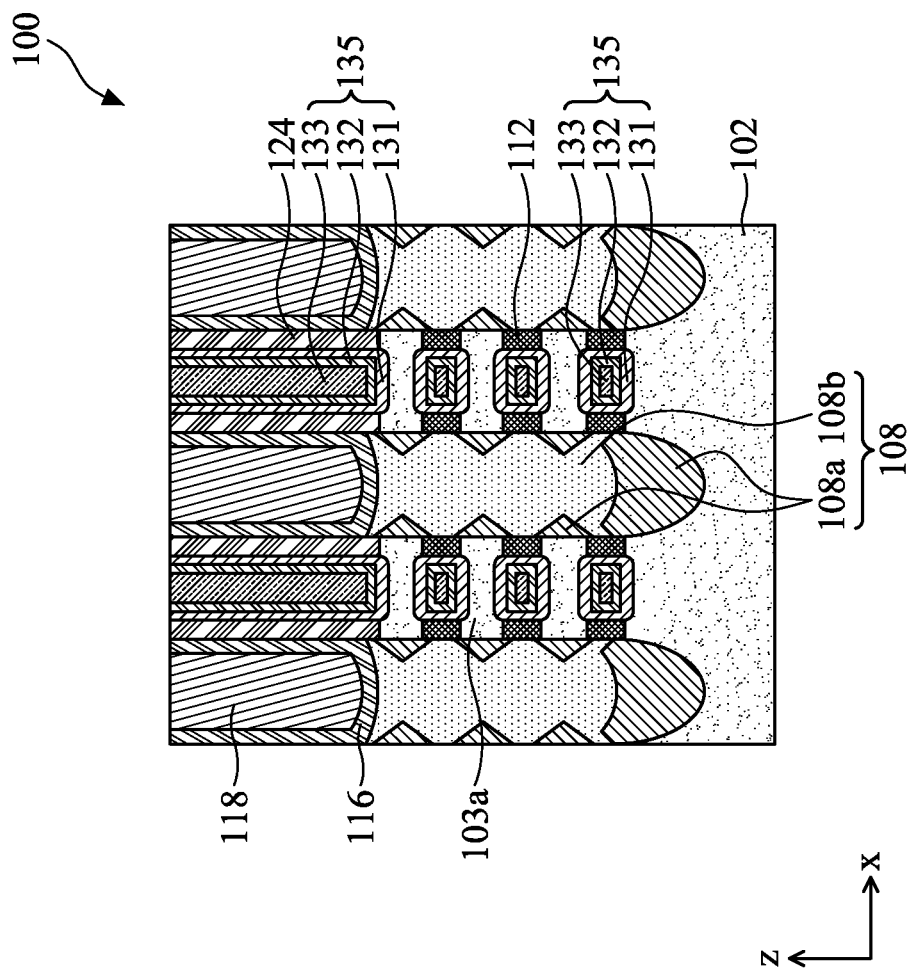

At operation 26, the method 10 (FIG. 1B) forms high-k metal gate stacks (HKMG) 135 in the gate trenches 125, surrounding each of the semiconductor layers 103a (FIG. 11). In an embodiment, the HKMG 135 includes a gate dielectric layer 131, a work function metal layer 132 over the gate dielectric layer 131, and a metal fill layer 133 over the work function metal layer 132. The gate dielectric layer 131 may include a high-k dielectric material such as hafnium oxide, zirconium oxide, lanthanum oxide, titanium oxide, yttrium oxide, and strontium titanate. The gate dielectric layer 131 may be formed by chemical oxidation, thermal oxidation, atomic layer deposition (ALD), chemical vapor deposition (CVD), and/or other suitable methods. In some embodiments, the HKMG 135 further includes an interfacial layer between the gate dielectric layer 131 and the semiconductor layers 103a. The interfacial layer may include silicon oxide, silicon oxynitride, or other suitable materials. In some embodiments, the work function metal layer 132 includes an n-type or a p-type work function layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. The work function metal layer 132 may be formed by CVD, PVD, ALD, and/or other suitable processes. In embodiments, the metal fill layer 133 may include aluminum, tungsten, cobalt, copper, and/or other suitable materials, and may be formed by CVD, PVD, plating, and/or other suitable processes.

Figure 12:
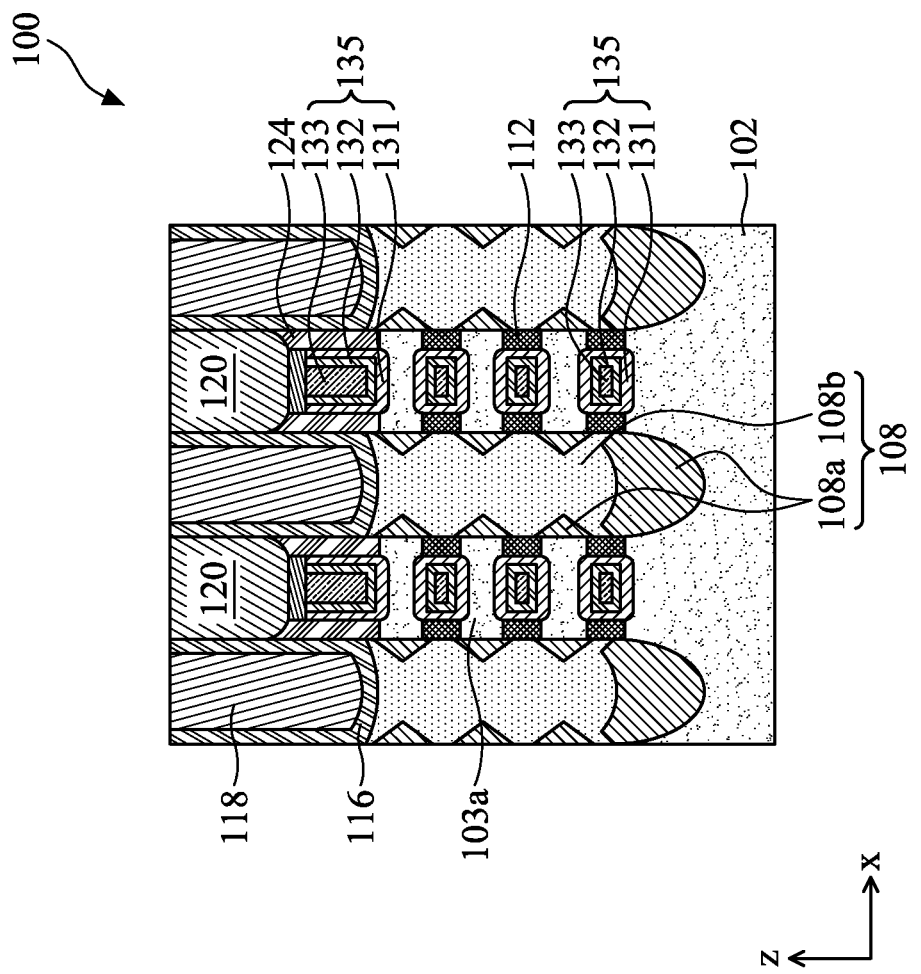

At operation 28, the method 10 (FIG. 1B) forms a dielectric cap (or dielectric gate cap) 120 over the HKMG 135, such as shown in FIG. 12. In an embodiment, the dielectric cap 120 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, other suitable material(s), or a combination thereof. The dielectric cap 120 protects the HKMG 135 from etching and CMP processes that are used for etching S/D contact trenches to be discussed later. The dielectric cap 120 may be formed by recessing the HKMG 135 and the gate spacers 124; depositing one or more dielectric materials over the CESL 116, the ILD 118, and the recessed HKMG 135 and gate spacers 124; and performing a CMP process to the one or more dielectric materials to expose the CESL 116 and the ILD 118. In some embodiments (not shown), the HKMG 135 is recessed but the gate spacers 124 are not recessed. In such embodiment, the dielectric cap 120 is formed above the recessed HKMG 135 and between the gate spacers 124. The dielectric cap 120 may include one or multiple layers of dielectric materials (two layers shown in the embodiment depicted in FIG. 12).

Figure 13:
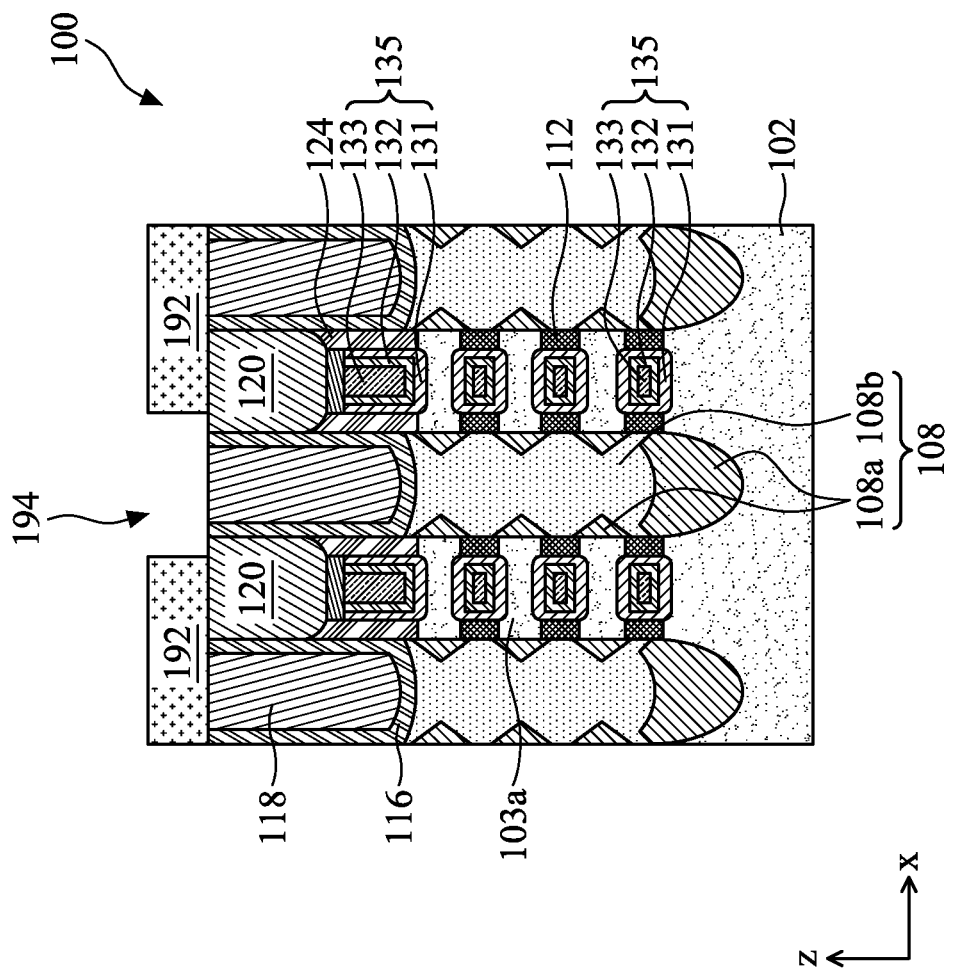

At operation 30, the method 10 (FIG. 1B) forms a patterned etch mask 192 over the device 100, such as shown in FIG. 13. The patterned etch mask 192 provides opening(s) 194 through which the device 100 is etched to form S/D contact trenches to be discussed later. The mask 192 includes a material that is different than a material of the ILD layer 118, the CESL 116, and the S/D feature 108 to achieve etching selectivity during the subsequent etching processes. For example, the mask 192 may include a resist material (and thus may be referred to as a patterned resist layer and/or a patterned photoresist layer). In some embodiments, the mask 192 has a multi-layer structure, such as a resist layer disposed over an anti-reflective coating (ARC) layer. The present disclosure contemplates other materials for the mask 192, so long as the above etching selectivity is achieved. In some embodiments, the operation 30 includes a photolithography process that includes forming a resist layer over the device 100 (e.g., by spin coating), performing a pre-exposure baking process, performing an exposure process using a photomask, performing a post-exposure baking process, and developing the exposed resist layer in a developer solution. After development, the patterned resist layer (e.g., patterned mask 192) includes a resist pattern that corresponds with the photomask. Alternatively, the exposure process can be implemented or replaced by other methods, such as maskless lithography, e-beam writing, ion-beam writing, or combinations thereof.

As shown in FIG. 13, the opening 194 exposes the ILD layer 118 directly above the S/D feature 108 to be etched. The opening 194 may also exposes some portions of the CESL 116 and the dielectric cap 120. As will be discussed, the subsequent etching (or part thereof) may be tuned selective to the materials of the ILD layer 118 and the S/D feature 108 with respect to the materials of the CESL 116 and the dielectric cap 120 (i.e., it may etch the ILD layer 118 and the S/D feature 108 with little to no etching of the CESL 116 and the dielectric cap 120). Thus, the etching can be self-aligned to the ILD layer 118, and the opening 194 can be designed to be slightly larger than the width of the ILD layer 118. This provides design margin for the photolithography process that forms the etch mask 192.

Figure 14:
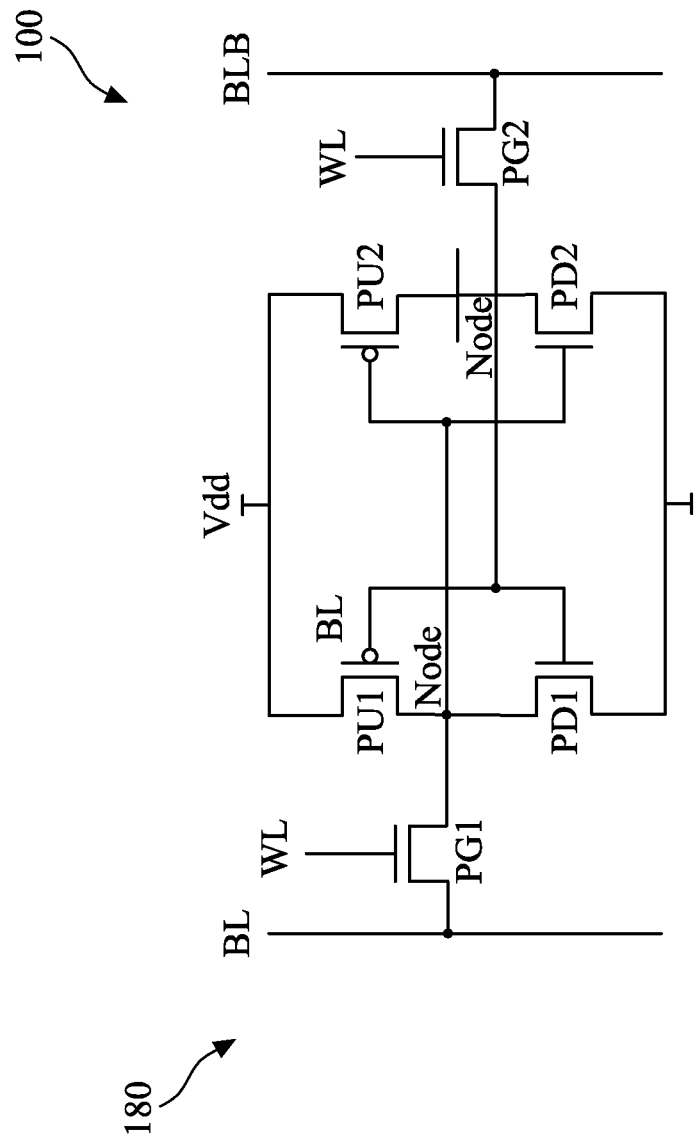
FIGS. 14 and 15 are a schematic and a layout, respectively, of an SRAM cell that are implemented according to various aspects of the present disclosure.

In some embodiments, the device 100 includes SRAM cells 180. An example SRAM cell 180 is illustrated in FIG. 14 (schematic view) and FIG. 15 (layout view). Referring to FIG. 14, the SRAM cell 180 includes two p-type transistors as pull-up transistors, PU-1 and PU-2; two n-type transistors as pull-down transistors, PD-1 and PD-2; and two n-type transistors as pass-gate transistors, PG-1 and PG-2. The sources of the PU1 and PU2 are connected to power supply Vdd. The sources of the PD1 and PD2 are connected to negative power supply or ground lines Vss. The PU-1 and PD-1 are coupled to form an inverter. The PU-2 and PD-2 are coupled to form another inverter. The two inverters are cross-coupled to form a storage unit of the SRAM cell 180, designated with two circuit nets Node and $\overline{\text{Node}}$ where Node connects the drains of the PU1, PD1, and PG1 and the gates of PU2 and PD2, and $\overline{\text{Node}}$ connects the drains of the PU2, PD2, and PG2 and the gates of PU1 and PD1. The SRAM cell 180 further includes word line(s) (WL) connecting to the gates of the PG1 and PG2 and bit lines (BL and BLB) connecting to the sources of the PG1 and PG2 for accessing the storage unit of the SRAM cell 180.

Figure 15:
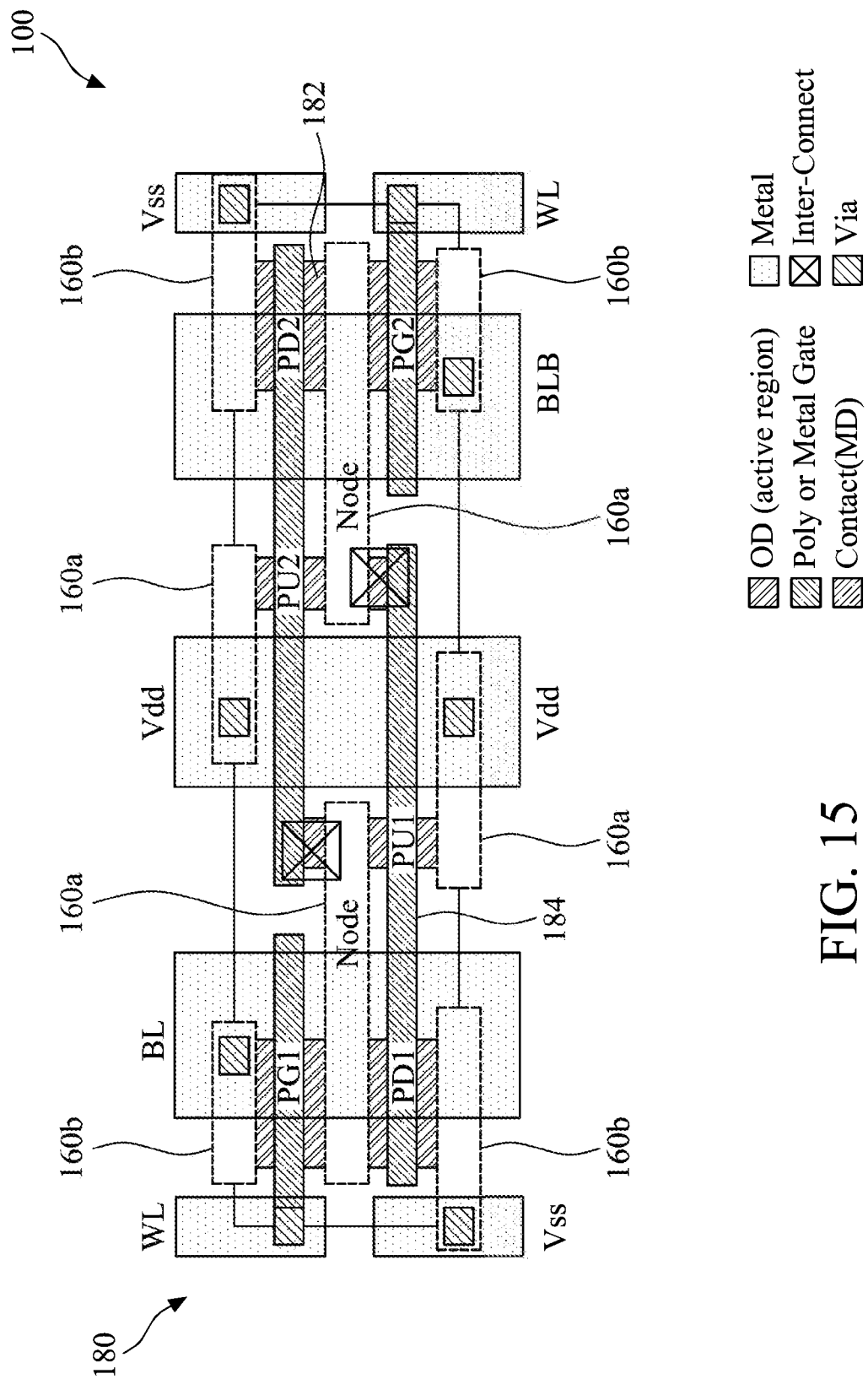

FIG. 15 illustrates a layout of the SRAM cell 180 in an embodiment. Referring to FIG. 15, the SRAM cell 180 includes active regions 182 oriented vertically and gate regions 184 oriented horizontally. In the present embodiment, the transistors PU1, PU2, PD1, PD2, PG1, and PG2 are implemented as GAA transistors. The active regions 182 include channel regions (where the semiconductor layers 103a are provided) and S/D regions (where the S/D features 108 are provided). The gate regions 184 are where the HKMG 135 are provided. The transistors PU1, PU2, PD1, PD2, PG1, and PG2 are formed where the active regions 182 and the gate regions 184 cross. FIG. 15 further illustrates S/D contacts 160 in dashed boxes, including S/D contacts 160a that extend over S/D regions for PMOS GAA transistors PU1 and PU2, and S/D contacts 160b that extend over S/D regions for NMOS GAA transistors PD1, PG1, PD2, and PG2. In an embodiment, the openings 194 (FIG. 13) correspond to the S/D contacts 160a and 160b (FIG. 15). In another embodiment, the openings 194 (FIG. 13) correspond to the S/D contacts 160a but not the S/D contacts 160b (FIG. 15). For example, the deep S/D contacts (such as the S/D contact 160 shown in FIGS. 20, 21, and 22) according to the present disclosure may work particularly well as the S/D contacts 160a. As will be discussed, forming the deep S/D contacts according to the present disclosure may advantageously reduce the transistor's electrical resistance (when the transistor is turned on) but at the expense of decreased strain in the corresponding S/D feature 108. For the PMOS transistors PU1 and PU2, the decreased strain may not noticeably impact the transistor performance, but the reduced electrical resistance may noticeably improve the transistor performance. In such cases, the deep S/D contacts according to the present disclosure are highly desirable. It is noted that the deep S/D contacts according to the present disclosure can be implemented as the S/D contacts for NMOS GAA transistors, PMOS GAA transistors, or other types of transistors where reduced electrical resistance is desired.

Figure 16:
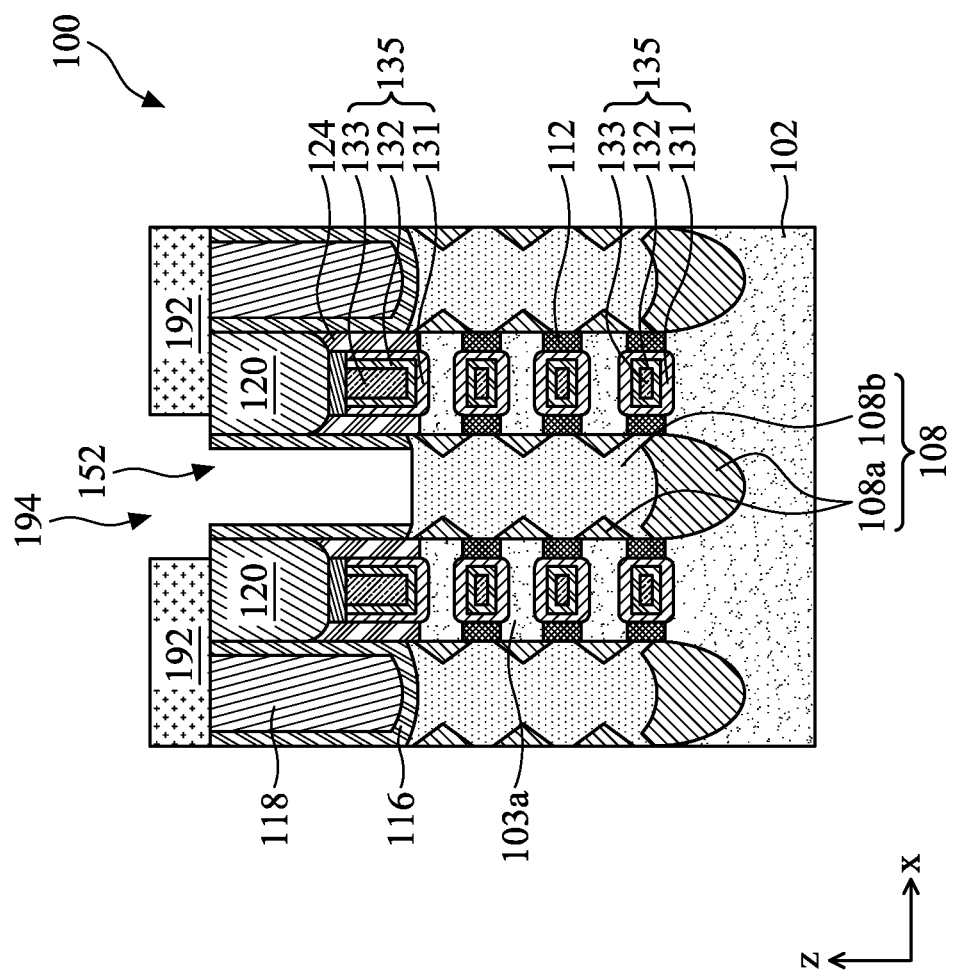

At operation 32, the method 10 (FIG. 1B) etches the ILD layer 118 through the opening 194 to form part of a S/D contact trench 152. The operation 32 may apply a dry etching process, a wet etching process, a reactive ion etching process, or other suitable etching processes. The etching process is tuned selective to the material of the ILD layer 118, and with no (or minimal) etching to the dielectric cap 120 and the CESL 116. The etching of the ILD layer 118 may expose the CESL 116 at the bottom of the trench 152 (not shown). Subsequently, the operation 32 may apply another etching process to break through the CESL 116 at the bottom of the trench 152, thereby exposing a top portion of the S/D feature 108, such as shown in FIG. 16. The operation 32 may use a dry etching process, a wet etching process, or a reactive ion etching process to etch the CESL 116. Particularly, this etching process is anisotropic and is tuned selective to the CESL 116. The dielectric cap 120 and the CESL 116 on the sidewalls of the dielectric cap 120 may be slightly etched by this etching process. In various embodiments, the ILD layer 118 and the CESL 116 may be etched by one joint etching process or by more than one etching process.

Figure 17:
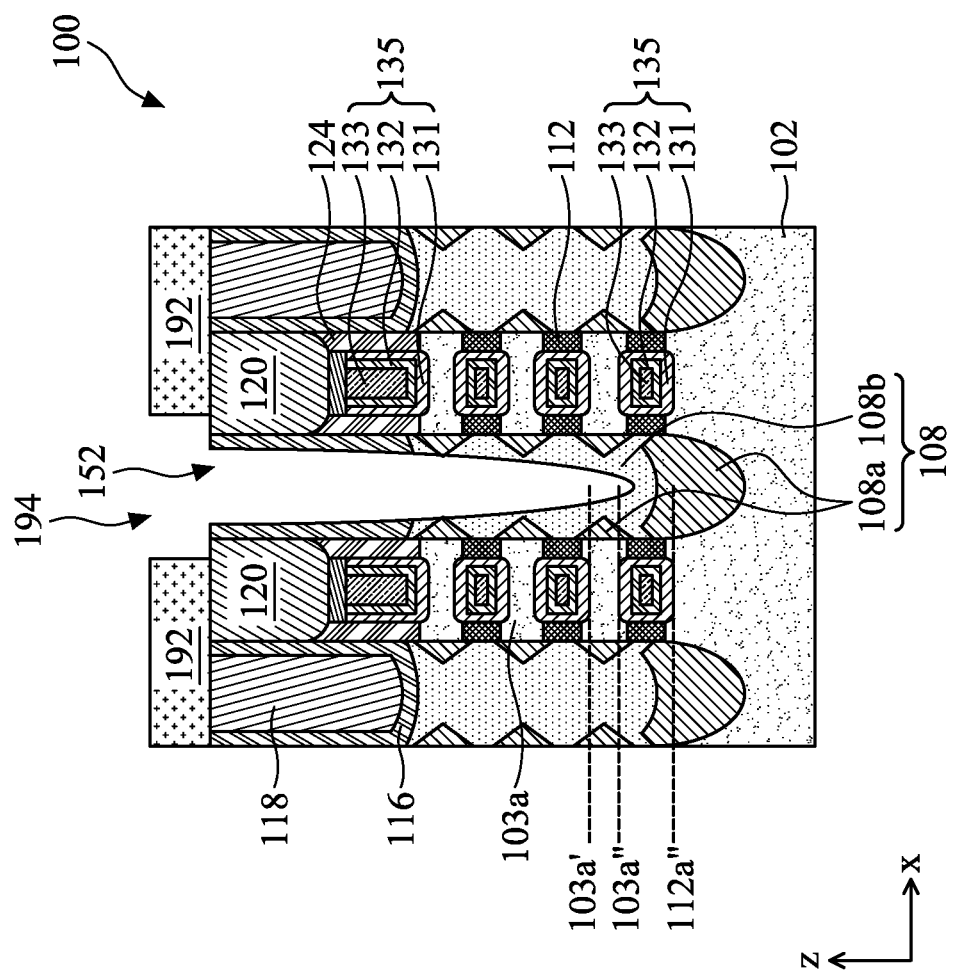

At operation 34, the method 10 (FIG. 1B) etches the S/D feature 108 through the opening 194 to extend the S/D contact trench 152 deeply into the S/D feature 108, such as shown in FIG. 17. The operation 34 may apply a dry etching process, a wet etching process, a reactive ion etching process, or other suitable etching processes. The etching process may be isotropic in an embodiment or anisotropic in another embodiment. The etching process is tuned selective to the material of the S/D feature 108, and with no (or minimal) etching to the dielectric cap 120 and the CESL 116. In an embodiment, the etchants used in the operations 32 and 34 are different etchants. In some embodiments, a dry etching process (such as a surface gas/radical reaction process) utilizes a fluorine-containing gas (for example, HF, $F_2$, $NF_3$, $CF_4$, $SF_6$, $CH_2F_2$, $CHF_3$, and/or $C_2F_6$) to selectively etch the S/D feature 108 which includes silicon germanium. In some embodiments, a wet etching process utilizes an etching solution that includes ammonium hydroxide ($NH_4OH$) and water ($H_2O$) to selectively etch the S/D feature 108. The present disclosure contemplates any suitable etchants and any suitable etching techniques for the operation 34.

The etching process is controlled (for example, using a timer) such that the trench 152 reaches deeply into the S/D feature 108 but does not penetrate completely through the S/D feature 108 (i.e., the trench 152 does not expose the substrate 102). In the embodiment depicted in FIG. 17, the bottom of the trench 152 reaches to a level that is below the bottom surface 103a" of the bottommost layer of the semiconductor layers 103a. In another embodiment (not shown), the bottom of the trench 152 reaches to a level that is below the bottom surface 112a" of the bottommost inner spacer 112. In yet another embodiment (not shown), the bottom of the trench 152 reaches to a level that is below the upper surface 103a' of the bottommost layer of the semiconductor layers 103a but above the bottom surface 103a". In various embodiment, the bottom of the trench 152 may reach to a level that is between the surface 103a' and the surface 112a". In some embodiments where the S/D feature 108 includes multiple layers, the etching process is controlled such that the trench 152 does not expose the bottommost layer of the S/D feature 108 which has a relatively lower dopant concentration than upper layer(s) of the S/D feature 108. For example, this may advantageously reduce the series resistance between the S/D feature 108 and the silicide that is subsequently formed in the trench 152. As will be discussed, the deep trench 152 allows a deep S/D contact 160 to be formed therein, which is brought closer to the semiconductor layers 103a than would a S/D contact that merely sits atop the S/D feature 108 before etching. Such deep S/D contact advantageously reduces the electrical resistance through the GAA transistor. After the etching of the S/D feature 108 finishes, the operation 34 removes the etch mask 192, for example, using stripping, ashing, etching, or other suitable processes.

Figure 18:
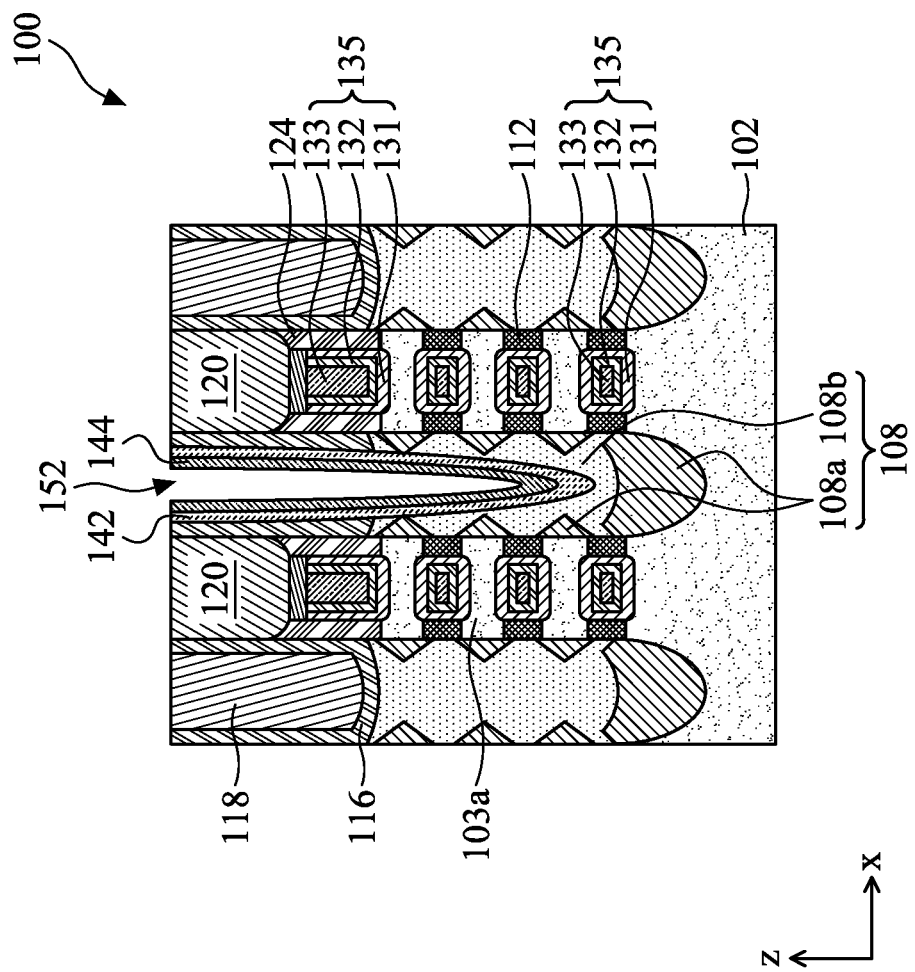
Figure 19:
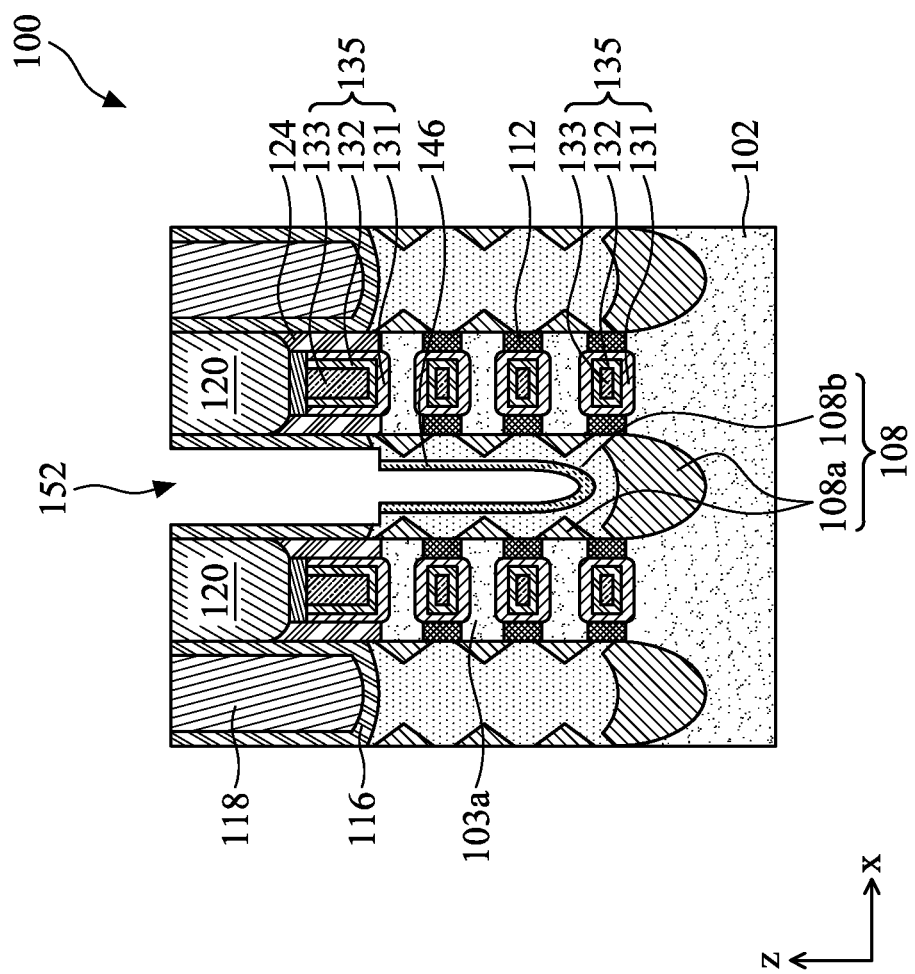

At operation 36, the method 10 (FIG. 1B) forms a silicide layer 146 over the exposed surfaces of the S/D feature 108 and in the trench 152, such as shown in FIG. 19. In an embodiment, this may involve multiple steps. For example, the operation 36 may first deposit a metal layer 142 over exposed surfaces of the S/D feature 108 and in the trench 152 and then deposits a metal nitride layer 144 over the metal layer 142, such as shown in FIG. 18. In an embodiment, the metal layer 142 is deposited to a thickness that does not completely fill the contact trench 152. In a further embodiment, the metal nitride layer 144 is deposited to a thickness such that the two layers 142 and 144 collectively do not completely fill the contact trench 152. Having such thickness configuration eases the subsequent step of removing (or pulling back) the metal nitride layer 144 and any un-reacted portion of the metal layer 142 post silicidation process. The metal layer 142 may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The metal nitride layer 144 may include a nitride of the metal layer 142 or a nitride of a metal that is different than the metal in the layer 142. For example, the metal nitride layer 144 may include titanium nitride, tantalum nitride, tungsten nitride, or other suitable metal nitride. After the deposition of the layers 142 and 144, the operation 36 then performs an annealing process to the device 100 to cause reaction between the one or more metals in the metal layer 142 and the semiconductor material(s) in the S/D features 108 to produce the silicide layer 146. Subsequently, the operation 36 removes the metal nitride layer 144 and any un-reacted portions of the metal layer 142, leaving the silicide layer 146 exposed in the contact trench 152, such as shown in FIG. 19. The silicide layer 146 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In some embodiments where the S/D feature 108 includes multiple layers (such as the layers 108a and 108b), the silicide layer 146 is formed over the upper layer (such as the layer 108b) that is more highly doped with a dopant than the bottom layer of the S/D feature 108. This beneficially reduces the series resistance between the S/D feature 108 and the silicide layer 146.

Figure 20:
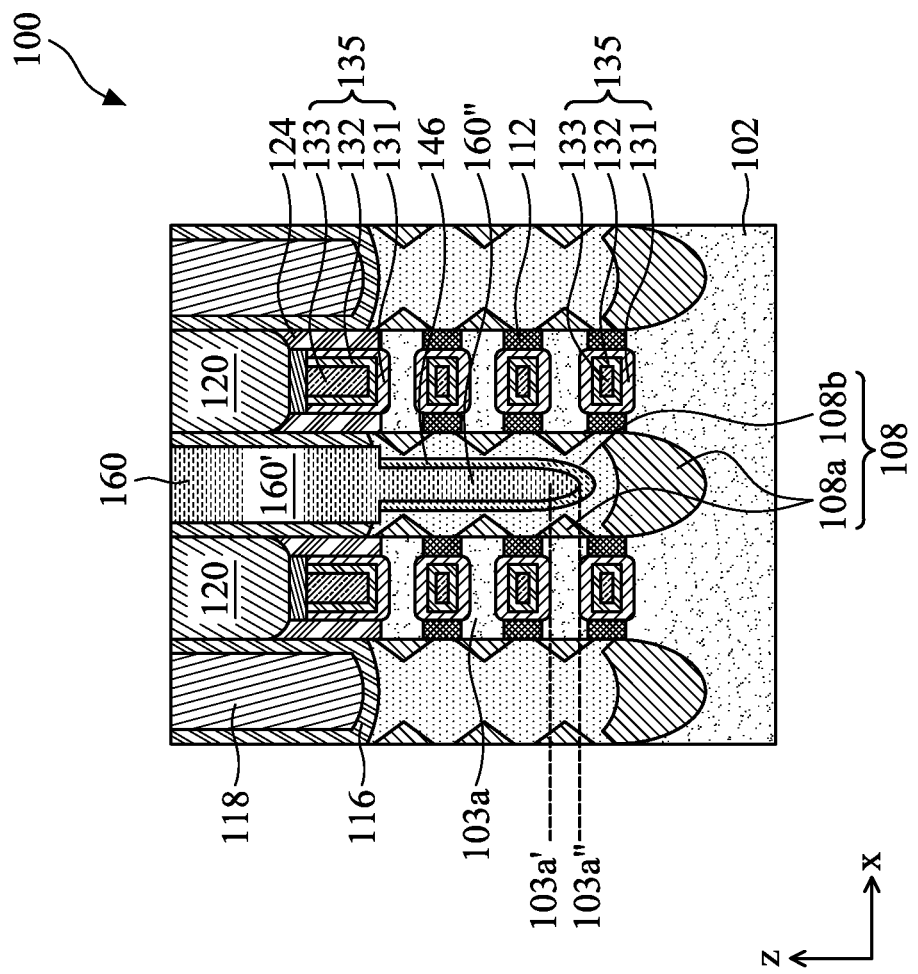

At operation 38, the method 10 (FIG. 1B) forms a metallic contact (or a metallic deep contact) 160 over the silicide layer 146, over the sidewalls of the CESL 116, and filling the trench 152, such as shown in FIG. 20. In an embodiment, the operation 138 deposits one or more metals or metallic materials 160 into the contact trench 152 and filling the contact trench 152, and then performs a CMP process to planarize a top surface of the device 100 and to remove excessive portions of the one or more metals 160. The remaining portion of the one or more metals 160 becomes the contact 160. As a result, the top surface of the contact 160, the top surface of the ILD layer 118, the top surface of the CESL 116, and the top surface of the dielectric cap 120 become coplanar or substantially coplanar. In embodiments, the contact 160 may include tungsten (W), cobalt (Co), copper (Cu), Ruthenium (Ru), other metals, metal nitrides such as titanium nitride (TiN), titanium aluminum nitride (TiAlN), tungsten nitride (WN), tantalum nitride (TaN), or combinations thereof, and may be formed by CVD, PVD, plating, and/or other suitable processes. In some embodiments, the contact 160 includes a layer of metal nitride (e.g., TiN, TiAlN, WN, or TaN) and a layer of metal (e.g., W, Co, or Cu) over the layer of the metal nitride.

Figure 21:
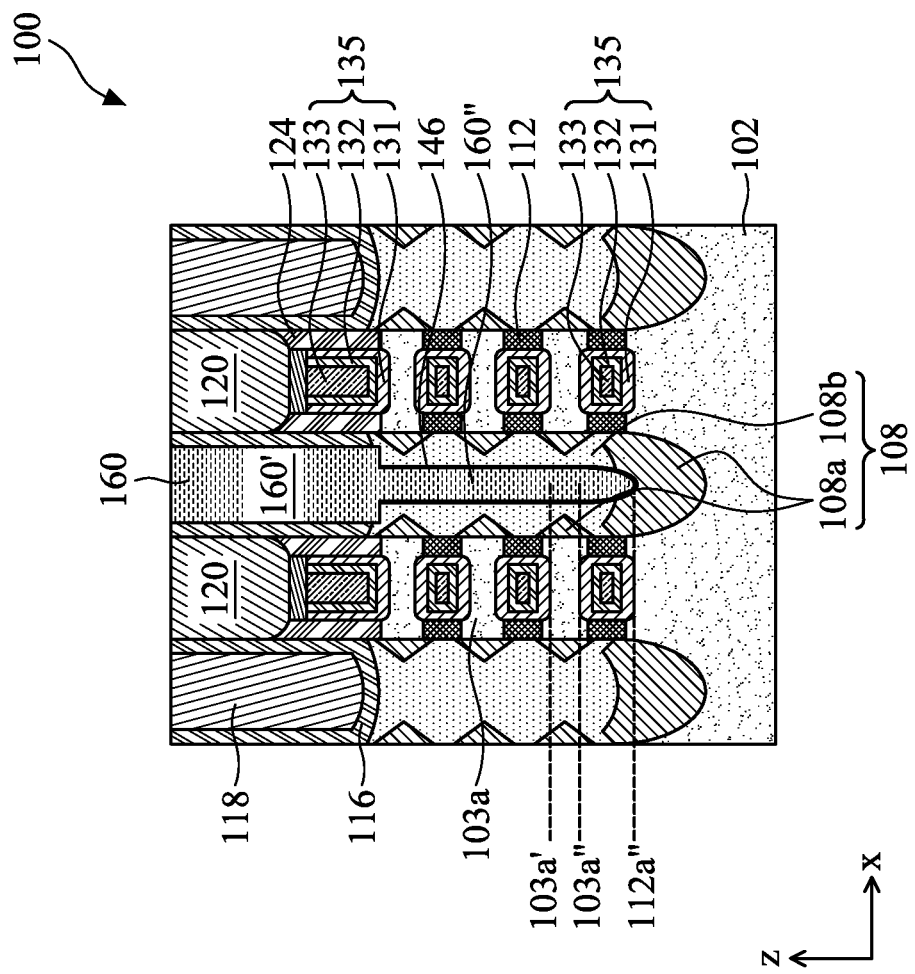
Figure 22:
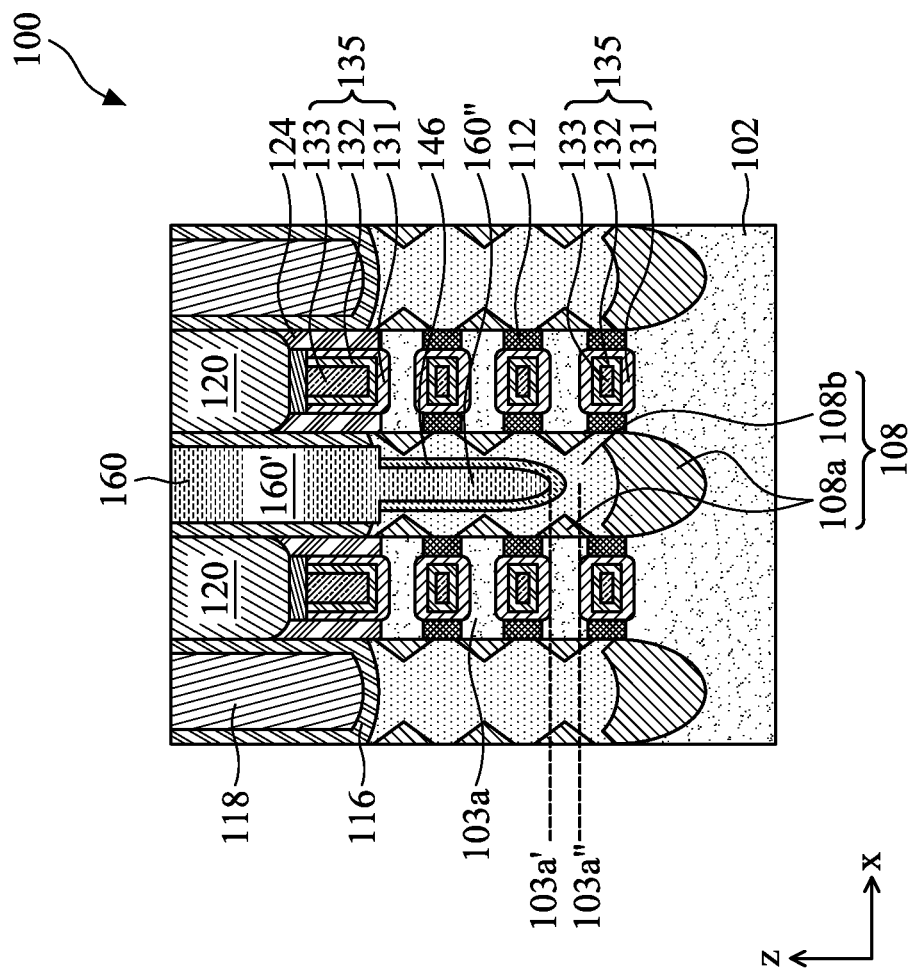

Referring to FIG. 20, the contact 160 includes a bottom portion 160" and an upper portion 160' on the bottom portion 160". The bottom portion 160" is below the bottom of the CESL 116 and extends deeply into the S/D feature 108. The upper portion 160' is disposed between two opposing portions of the CESL 116 and is above the S/D feature 108. In the embodiment depicted in FIG. 20, the bottom surface of the deep contact 160 extends below the bottom surface 103a" of the bottommost layer of the semiconductor layers 103a. In the embodiment depicted in FIG. 21, the bottom surface of the deep contact 160 extends below the bottom surface 112a" of the bottommost feature of the inner spacers 112. In the embodiment depicted in FIG. 22, the bottom surface of the deep contact 160 extends below the upper surface 103a' of the bottommost layer of the semiconductor layers 103a but above the bottom surface 103a". In some embodiments, the bottom surface of the deep contact 160 extends below the surface 103a' but above the surface 112a". The electrical resistance between the semiconductor layers (channels) 103a and the deep contact 160 is greatly reduced compared to the case where the S/D contact did not include the lower portion 160". In an example where the device 100 includes SRAM cells 180 (FIGS. 14 and 15), any of the contacts 160a and 160b may be implemented with the deep contact 160 such as shown in FIGS. 20-22.

At operation 40, the method 10 (FIG. 1B) performs further fabrication steps to the device 100. For example, the method 10 may form gate contacts connecting to the HKMG 135, form S/D contact vias connecting to the S/D contact 160, and form interconnect layers.

Although not intended to be limiting, embodiments of the present disclosure provide one or more of advantages. For example, embodiments of the present disclosure provide deep S/D contacts for GAA devices. A deep S/D contact extends vertically and deeply into an S/D feature and vertically covers (or overlaps with) all channel layers in a GAA device. This advantageously reduces the electrical resistance between the channels and the S/D contact, thereby improving the performance of the GAA device. Further, embodiments of the present disclosure can be readily integrated with existing semiconductor manufacturing processes.

In one example aspect, the present disclosure is directed to a method that includes providing a structure having a substrate, a source/drain (S/D) feature over the substrate, semiconductor channel layers over the substrate and connecting to the S/D feature, a high-k metal gate (HKMG) wrapping around the semiconductor channel layers, a dielectric cap over the HKMG, a contact etch stop layer (CESL) over the S/D feature and on sidewalls of the dielectric cap and the HKMG, and an interlayer dielectric (ILD) layer over the CESL, wherein the semiconductor channel layers are spaced one from another along a direction that is perpendicular to a top surface of the substrate. The method further includes etching the ILD layer and the CESL to expose a top portion of the S/D feature. After the etching of the ILD layer and the CESL, the method further includes etching the S/D feature, resulting in a S/D contact trench, wherein a bottom surface of the S/D contact trench is below an upper surface of a bottommost layer of the semiconductor channel layers. The method further includes forming a metallic contact in the S/D contact trench.

In an embodiment of the method, the etching of the S/D feature applies an etchant that is selective to materials of the S/D feature with respect to materials of the CESL and the dielectric cap. In another embodiment, the etching of the S/D feature applies an anisotropic etching process. In yet another embodiment, the bottom surface of the S/D contact trench is below a bottom surface of the bottommost layer of the semiconductor channel layers.

In an embodiment, after the etching of the S/D feature and before the forming of the metallic contact, the method further includes forming a silicide layer over the S/D feature and in the S/D contact trench, wherein the metallic contact is formed over the silicide layer. In a further embodiment, the forming of the silicide layer includes depositing a first metal layer over surfaces of the S/D feature exposed in the S/D contact trench and without filling the S/D contact trench; depositing a metal nitride layer over the first metal layer and without filling the S/D contact trench; annealing the structure so that the first metal layer reacts with the S/D feature to form the silicide layer; and after the annealing, removing the metal nitride layer. In a further embodiment, the first metal layer includes titanium, the metal nitride layer includes titanium nitride, and the metallic contact includes cobalt.

In an embodiment of the method, the S/D feature is part of a PMOS transistor. In a further embodiment, the PMOS transistor is a pull-up transistor of an SRAM cell.

In another embodiment, the method further includes forming a patterned etch mask over the structure, wherein the patterned etch mask provides an opening directly above the S/D feature, wherein the etching of the ILD layer and the CESL and the etching of the S/D feature are performed through the opening. the method further includes removing the patterned etch mask after the etching of the S/D feature and before the forming of the metallic contact.

In another example aspect, the present disclosure is directed to a method that includes providing a structure having a substrate, two source/drain (S/D) features over the substrate, semiconductor channel layers stacked over the substrate and connecting the two S/D features, a high-k metal gate (HKMG) wrapping around each of the semiconductor channel layers, inner spacers laterally between the HKMG and each of the two S/D features, a dielectric cap over the HKMG, a contact etch stop layer (CESL) over the S/D features and on sidewalls of the dielectric cap and the HKMG, and an interlayer dielectric (ILD) layer over the CESL. The method further includes forming a patterned etch mask that provides an opening directly above one of the S/D features; first etching the ILD layer and the CESL to expose a top portion of the one of the S/D features; second etching the one of the S/D features, resulting in a S/D contact trench, wherein a bottom surface of the S/D contact trench is below a bottom surface of a bottommost layer of the semiconductor channel layers; forming a silicide layer over the one of the S/D features and in the S/D contact trench; and forming a metallic contact over the silicide layer and in the S/D contact trench.

In an embodiment of the method, the bottom surface of the S/D contact trench is below a bottom surface of a bottommost one of the inner spacers. In another embodiment, the one of the S/D features includes a first layer and a second layer over the first layer, wherein the first layer is more lightly doped than the second layer, and wherein the S/D contact trench does not expose the first layer.

In an embodiment, the method further includes removing the patterned etch mask after the second etching and before the forming of the silicide layer. In another embodiment, the first etching and the second etching use different etchants.

In yet another example aspect, the present disclosure is directed to a semiconductor structure. The semiconductor structure includes a substrate; a source/drain (S/D) feature over the substrate; semiconductor channel layers over the substrate and connecting to the S/D feature, wherein the semiconductor channel layers are spaced one from another along a direction that is perpendicular to a top surface of the substrate; a high-k metal gate (HKMG) wrapping around each of the semiconductor channel layers; inner spacers laterally between the HKMG and the S/D feature; and a metallic contact over the S/D feature, wherein a bottom surface of the metallic contact is below an upper surface of a bottommost layer of the semiconductor channel layers.

In an embodiment, the semiconductor structure further includes a dielectric cap over the HKMG and a contact etch stop layer (CESL) over the S/D feature and on sidewalls of the dielectric cap and the HKMG, wherein top surfaces of the metallic contact, the dielectric cap, and the CESL is coplanar.

In another embodiment, the S/D feature is part of a PMOS transistor of an SRAM cell. In an embodiment, the semiconductor structure further includes a silicide layer between the metallic contact and the S/D feature. In a further embodiment, the S/D feature includes a first layer and a second layer over the first layer, wherein the second layer is more highly doped with a dopant than the first layer, wherein the silicide layer does not contact the first layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    providing a structure having a substrate, a source/drain (S/D) feature over the substrate, semiconductor channel layers over the substrate and connecting to the S/D feature, a high-k metal gate (HKMG) wrapping around the semiconductor channel layers, a dielectric cap over the HKMG, a contact etch stop layer (CESL) over the S/D feature and on sidewalls of the dielectric cap and the HKMG, and an interlayer dielectric (ILD) layer over the CESL, wherein the semiconductor channel layers are spaced one from another along a direction that is perpendicular to a top surface of the substrate, and wherein the providing comprises:
        growing a first portion of the S/D feature vertically over the substrate and laterally over side surfaces of the semiconductor channel layers, wherein the first portion includes $Si_{1-x}Ge_x$; and
        growing a second portion of the S/D feature over the first portion, wherein the second portion is more doped than the first portion, wherein the second portion includes $Si_{1-y}Ge_y$, and wherein y is greater than x;
    etching the ILD layer and the CESL to expose a top portion of the S/D feature;
    after the etching of the ILD layer and the CESL, etching the S/D feature, resulting in a S/D contact trench, wherein a bottom surface of the S/D contact trench is below an upper surface of a bottommost layer of the semiconductor channel layers; and
    forming a metallic contact in the S/D contact trench.

2. The method of claim 1, wherein the etching of the S/D feature applies an etchant that is selective to materials of the S/D feature with respect to materials of the CESL and the dielectric cap.

3. The method of claim 1, wherein the etching of the S/D feature applies an anisotropic etching process.

4. The method of claim 1, wherein the bottom surface of the S/D contact trench is below a bottom surface of the bottommost layer of the semiconductor channel layers.

5. The method of claim 1, after the etching of the S/D feature and before the forming of the metallic contact, further comprising:
forming a silicide layer over the S/D feature and in the S/D contact trench, wherein the metallic contact is formed over the silicide layer.

6. The method of claim 5, wherein the forming of the silicide layer includes:
depositing a first metal layer over surfaces of the S/D feature exposed in the S/D contact trench and without filling the S/D contact trench;
depositing a metal nitride layer over the first metal layer and without filling the S/D contact trench;
annealing the structure so that the first metal layer reacts with the S/D feature to form the silicide layer; and
after the annealing, removing the metal nitride layer.

7. The method of claim 6, wherein the first metal layer includes titanium, the metal nitride layer includes titanium nitride, and the metallic contact includes cobalt.

8. The method of claim 1, wherein the S/D feature is part of a PMOS transistor, and wherein the PMOS transistor is a pull-up transistor of an SRAM cell.

9. The method of claim 1, wherein the first portion includes a plurality of laterally protruding segments that protrude laterally toward the second portion.

10. The method of claim 1, further comprising:
forming a patterned etch mask over the structure, wherein the patterned etch mask provides an opening directly above the S/D feature, wherein the etching of the ILD layer and the CESL and the etching of the S/D feature are performed through the opening; and
removing the patterned etch mask after the etching of the S/D feature and before the forming of the metallic contact.

11. A method comprising:
providing a structure having a substrate, a first source/drain (S/D) feature and a second S/D feature formed over the substrate, semiconductor channel layers stacked over the substrate and connecting the first S/D feature and the second S/D feature, a high-k metal gate (HKMG) wrapping around each of the semiconductor channel layers, inner spacers laterally between the HKMG and each of the first S/D feature and the second S/D feature, a dielectric cap over the HKMG, a contact etch stop layer (CESL) over the S/D features and on sidewalls of the dielectric cap and the HKMG, and an interlayer dielectric (ILD) layer over the CESL, wherein the providing comprises:
forming the first S/D feature vertically over the substrate and laterally over side surfaces of the semiconductor channel layers, wherein the first S/D feature contains $Si_{1-x}Ge_x$; and
forming the second S/D feature over the first S/D feature, wherein the second S/D feature is more doped than the first S/D feature, wherein the second S/D feature contains $Si_{1-y}Ge_y$, and wherein y is greater than x;
forming a patterned etch mask that provides an opening directly above one of the S/D features;
first etching the ILD layer and the CESL to expose a top portion of the one of the S/D features;
second etching the one of the S/D features, resulting in a S/D contact trench, wherein a bottom surface of the S/D contact trench is below a bottom surface of a bottommost layer of the semiconductor channel layers;
forming a silicide layer over the one of the S/D features and in the S/D contact trench; and
forming a metallic contact over the silicide layer and in the S/D contact trench, wherein at least a portion of the metallic contact extends laterally to the silicide layer, wherein the metallic contact has a single material composition.

12. The method of claim 11, wherein the bottom surface of the S/D contact trench is below a bottom surface of a bottommost one of the inner spacers.

13. The method of claim 11, wherein the S/D contact trench does not expose the first layer.

14. The method of claim 11, further comprising:
removing the patterned etch mask after the second etching and before the forming of the silicide layer.

15. The method of claim 11, wherein the first etching and the second etching use different etchants.

16. A structure, comprising:
a substrate;
a source/drain (S/D) feature over the substrate, wherein the S/D feature includes a first layer and a second layer over the first layer, wherein the second layer is more highly doped with a dopant than the first layer, wherein the first layer contains $Si_{1-x}Ge_x$, and wherein the second layer contains $Si_{1-y}Ge_y$, wherein y is greater than x;
semiconductor channel layers over the substrate and connecting to the S/D feature, wherein the semiconductor channel layers are spaced one from another along a direction that is perpendicular to a top surface of the substrate;
a high-k metal gate (HKMG) wrapping around each of the semiconductor channel layers;
inner spacers laterally between the HKMG and the S/D feature; and
a metallic contact over the S/D feature, wherein a bottom surface of the metallic contact is below an upper surface of a bottommost layer of the semiconductor channel layers but above a bottommost surface of the HKMG.

17. The structure of claim 16, further comprising:
a dielectric cap over the HKMG; and
a contact etch stop layer (CESL) over the S/D feature and on sidewalls of the dielectric cap and the HKMG, wherein top surfaces of the metallic contact, the dielectric cap, and the CESL is coplanar.

18. The structure of claim 16, wherein the S/D feature is part of a PMOS transistor of an SRAM cell.

19. The structure of claim 16, further comprising a silicide layer between the metallic contact and the S/D feature, wherein the silicide layer does not extend to the first layer.

20. The structure of claim 16, further comprising a silicide layer, wherein:
the metallic contact includes an upper portion and a lower portion disposed below the upper portion;
the silicide layer is disposed on side surfaces of the lower portion but not on side surfaces of the upper portion; and
a lateral dimension of the upper portion is greater than a combined lateral dimension of the lower portion and the silicide layer in a cross-sectional side view.

* * * * *